(12) United States Patent
Buchholz et al.

(10) Patent No.: US 9,695,354 B2
(45) Date of Patent: Jul. 4, 2017

(54) FORMULATION IN HIGH-PURITY SOLVENT FOR PRODUCING ELECTRONIC DEVICES

(71) Applicant: Merck Patent GmbH, Darmstadt (DE)

(72) Inventors: Herwig Buchholz, Frankfurt am Main (DE); Thomas Eberle, Landau (DE); Junyou Pan, Frankfurt am Main (DE)

(73) Assignee: Merck Patent GmbH (DE)

( * ) Notice: Subject to any disclaimer, the term of this patent is extended or adjusted under 35 U.S.C. 154(b) by 69 days.

(21) Appl. No.: 14/442,760

(22) PCT Filed: Oct. 30, 2013

(86) PCT No.: PCT/EP2013/003269
§ 371 (c)(1),
(2) Date: May 14, 2015

(87) PCT Pub. No.: WO2014/079532
PCT Pub. Date: May 30, 2014

(65) Prior Publication Data
US 2015/0299562 A1 Oct. 22, 2015

(30) Foreign Application Priority Data

Nov. 20, 2012 (EP) .................................... 12007813

(51) Int. Cl.
| | | |
|---|---|---|
| C09K 11/02 | (2006.01) | |
| H01L 51/00 | (2006.01) | |
| C09K 11/06 | (2006.01) | |
| H01L 51/50 | (2006.01) | |

(52) U.S. Cl.
CPC ............ *C09K 11/025* (2013.01); *C09K 11/06* (2013.01); *H01L 51/0007* (2013.01); *H01L 51/0052* (2013.01); *H01L 51/0056* (2013.01); *H01L 51/0067* (2013.01); *H01L 51/0085* (2013.01); *C09K 2211/185* (2013.01); *H01L 51/502* (2013.01); *H01L 51/5016* (2013.01); *Y02E 10/549* (2013.01)

(58) Field of Classification Search
CPC ... C09K 11/025; C09K 11/06; H01L 51/0052; H01L 51/0067; H01L 51/0085; H01L 51/0056; H01L 51/502; H01L 51/0007; H01L 51/5016; C09K 2211/185; Y02E 10/549

USPC .................... 252/511, 519.21, 500
See application file for complete search history.

(56) References Cited

U.S. PATENT DOCUMENTS

| | | | | |
|---|---|---|---|---|
| 7,572,395 | B2 * | 8/2009 | Whiteford ............ | B82Y 10/00 |
| | | | | 136/252 |
| 7,794,600 | B1 * | 9/2010 | Buretea ................. | B01D 15/08 |
| | | | | 210/635 |
| 8,540,899 | B2 * | 9/2013 | Miller ............... | G11C 13/0009 |
| | | | | 252/364 |
| 9,236,572 | B2 * | 1/2016 | Tilyou ...................... | B32B 5/16 |
| 9,393,591 | B2 * | 7/2016 | Aldakov ............. | H01L 51/0003 |
| 9,425,365 | B2 * | 8/2016 | Kurtin ................... | H01L 33/502 |
| 2005/0238798 | A1 | 10/2005 | Mitsuya et al. | |
| 2012/0032115 | A1 * | 2/2012 | Harada ................. | H05B 33/14 |
| | | | | 252/301.16 |
| 2015/0349035 | A1 * | 12/2015 | Kuntz .................... | H01L 51/52 |
| | | | | 313/7 |

FOREIGN PATENT DOCUMENTS

EP 2416392 A2 2/2012

OTHER PUBLICATIONS

Liberato Manna et al., "Epitaxial Growth and Photochemical Annealing of Graded CDS/ZnS Shells on Colloidal CdSe Nanorods", J. Am. Chem. Soc., 2002, 124, 7136-7145.*
International Search Report for PCT/EP2013/003269 mailed Feb. 3, 2014.

* cited by examiner

*Primary Examiner* — Douglas McGinty
(74) *Attorney, Agent, or Firm* — Drinker Biddle & Reath LLP

(57) ABSTRACT

The present invention relates to a formulation with which electronic devices can be produced with improved performance with respect to operating voltage, efficiency and service life. The present invention likewise relates to a method for producing a formulation according to the invention and to a method for producing electronic devices using the formulation according to the invention. Furthermore, the present invention also relates to an electronic device that has been produced using the method according to the invention.

14 Claims, No Drawings

FORMULATION IN HIGH-PURITY SOLVENT FOR PRODUCING ELECTRONIC DEVICES

CROSS-REFERENCE TO RELATED APPLICATIONS

This application is a national stage application (under 35 U.S.C. §371) of PCT/EP2013/003269, filed Oct. 30, 2013, which claims benefit of European Application No. 12007813.14, filed Nov. 20, 2012.

The present invention relates to a formulation with which electronic devices having improved performance with respect to operating voltage, efficiency and lifetime can be produced. The present invention likewise relates to a process for the preparation of a formulation according to the invention, and to a process for the production of electronic devices using the formulation according to the invention. Furthermore, the present invention also relates to an electronic device produced by the process according to the invention.

Electronic components produced by printing, such as organic photovoltaic cells (OPVs), organic light-emitting devices (OLEDs) and organic thin-film transistors (TFTs), have attracted much attention in recent years since they can be produced inexpensively in large quantities by printing technologies, such as ink-jet printing, screen printing and roller printing. OLEDs are of particular economic interest here since they can be employed in display devices, lighting sources in general and in phototherapy.

In the past, predominantly small molecules were employed as useful components, for example as phosphorescence emitters, in organic electroluminescent devices. The use of small molecules in organic electroluminescent devices (SMOLED) facilitates good colour efficiencies, long lifetimes and the requisite low operating voltages. The disadvantage of such systems is, however, the complex production. Thus, for example, layer deposition of the small molecules requires complex processes, such as, for example, thermal coating processes under vacuum, which results in a limited maximum device size. On the other hand, soluble systems, both polymer and also soluble small molecules, which can be applied inexpensively in a layer from solutions, have the disadvantage of a shorter lifetime.

In general, the materials for the production of electronic devices should have a high degree of purity. Noteworthy examples thereof are on the one hand modern computers, which only exist owing the possibility of the preparation of high-purity silicon, on the other hand modern communications systems, which only exist owing to the possibility of the production of high-purity glass fibres.

It is therefore also of prime interest in the production of OLEDs to obtain high-purity starting materials. US 2005/0062012 discloses that a hole-transport material having a low sulfate ion content gives rise to better performance of the OLEDs obtained therefrom. EP 1063869 A1 discloses, for example, an OLED comprising an organic compound which contains impurities in a concentration of less than 1000 ppm. It is furthermore known to experts that there is a correlation between the purity of OLED materials and their performance, in particular the lifetime. However, in order to be able to apply the materials by printing, it is necessary to prepare a suitable formulation or solution which comprises the organic functional compounds or organic semiconductor materials. These formulations comprise at least one solvent.

During a printing process, such as, for example, in an ink-jet printing, screen printing or roller printing, the formulation and also the subsequently printed layer are exposed to the ambient atmosphere for a short time window (t1). This time window is dependent on the printing method and can vary a few minutes. Within this time window, oxygen and/or ozone from the environment can diffuse into the formulation or into the layer, which is harmful for the organic functional materials and thus also harmful for the electronic device. It is therefore desirable to delay or even prevent the diffusion of oxygen and/or ozone into the formulation or into the layer.

To date, however, only little attention has been paid to the purity of solvents. In the framework of the present invention, it will be shown that the purity of the solvents is actually no less important than the purity of the functional materials themselves. Commercially available solvents have a maximum degree of purity of only approximately 99.99%. Thus, for example, the purest toluene available from Sigma Aldrich only has a purity of 99.9%. In the past, some experiments were carried out on the use of solvents having an even higher degree of purity. US 2005/0238798 A1 and EP 01617708 A2 disclose, for example, OLEDs produced using solvents which have been subjected to dehydration and deoxygenation, where the content of oxygen and water was subsequently less than 20 ppm. However, since these processes are very complex preparatively, the need for simpler processes for the production of OLEDs having better performance is of prime interest.

It was therefore an object of the present invention to provide a formulation which can be used for the production of OLEDs having improved performance using layer deposition techniques.

In accordance with the invention, a formulation is provided for this purpose which comprises the following constituents:

(a) at least one nanocrystal and/or at least one functional organic material which is selected from the group consisting of hole-transport materials (HTM), hole-injection materials (HIM), electron-transport materials (ETM), electron-injection materials (EIM), hole-blocking materials (HBM), electron-blocking materials (EBM), exciton-blocking materials (ExBM), light-emitting materials, host materials, organic metal complexes, organic dyes and combinations thereof; and (b) at least one solvent which is supersaturated with an inert gas or a mixture of inert gases.

A "nanocrystal" is taken to mean in accordance with the invention a substance whose size is in the region of nanometers, i.e. a nanoparticle having a mostly crystalline structure. The size of the nanocrystals here is preferably in the range from 1 to 300 nm. In accordance with the invention, the nanocrystals are preferably semiconducting nanocrystals. Suitable semiconductor materials for the nanocrystal are selected from compounds of elements from group II-VI, such as CdSe, CdS, CdTe, ZnSe, ZnO, ZnS, ZnTe, HgS, HgSe, HgTe and alloys thereof, such as, for example, CdZnSe; group III-V, such as InAs, InP, GaAs, GaP, InN, GaN, InSb, GaSb, AlP, AlAs, AlSb and alloys thereof, such as InAsP, CdSeTe, ZnCdSe, InGaAs, Gruppe IV-VI, such as PbSe, PbTe and PbS and alloys thereof; group IIImVI, such as InSe, InTe, InS, GaSe and alloys thereof, such as InGaSe, InSeS; group IV semiconductors, such as Si and Ge alloys thereof, and combinations thereof.

In a preferred embodiment, the nanocrystal is a quantum dot.

"Quantum dots" (QDs) in the present invention are taken to mean a nanoscopic structure comprising a semiconductor material, such as, for example, InGaAs, CdSe, ZnO or also GaInP/InP. Quantum dots are characterised in that the charge carriers (electrons, holes) in a quantum dot are so restricted in their mobility in all three spatial directions that their energy can no longer adopt continuous values, but instead only discrete values. Quantum dots thus behave in a similar way to atoms, but can be influenced in their shape, size or the number of electrons in them. Their inherent atomic size order is typically about $10^4$ atoms. Owing to the limited size of the QDs, in particular the core/shell QDs, they exhibit unique optical properties in comparison with the corresponding bulk materials. The emission spectrum is defined by a simple Gaussian peak, which corresponds to the band edge transition. The position of the emission peak is determined by the particle size as a direct result of the quantum confinement effect. Further electronic and optical properties are discussed by Al. L. Efros and M. Rosen in Annu. Rev. Mater. Sci. 2000. 30:475-521.

In a preferred embodiment, the QD of the invention has a "core/shell" structure, as reported by X. Peng, et al., J. Am. Chem. Soc. Vol 119:7019-7029 (1997).

In a particularly preferred embodiment, quantum dots (QDs) are essentially monodispersive in their size. A QD has at least one region or characteristic dimension having a size of less than about 300 nm and larger than about 1 nm. The term monodispersive means that the size distribution lie within +/−10% of the value indicated. Thus, for example, in the case of a monodispersive nanocrystal having a diameter of 100 nm, the diameter is in the range from 90 nm to 110 nm.

In a particularly preferred embodiment, the QD comprises semiconducting materials selected from the group II-VI semiconductors, alloys thereof, and core/shell structures thereof. Group II-VI semiconductors CdSe, CdS, CdTe, ZnSe, ZnS, ZnTe, alloys thereof, combinations thereof and core/shell, core multishell layer structures thereof are in further embodiments.

"Nanorods" in the present invention are taken to mean a particle elongated in length having a size in the region of nanometers. The length to width ratio of the particle here is preferably in the range from 2 to 20. Nanorods are in colloidal form in the formulation according to the invention.

In a preferred embodiment, the nanocrystals, in particular QDs or nanorods, include the ligands which are conjugated, cooperated or associated on their surface. Suitable ligands for this purpose are well known to the person skilled in the art. Examples thereof are disclosed, for example, in U.S. Ser. No. 10/656,910 and U.S. 60/578,236. The use of ligands of this type increases the solubility or miscibility of the QDs in various solvents and matrix materials. Further preferred ligands are those having a "head-body-tail" structure, as disclosed in US 2007/0034833 A1, where furthermore the "body" preferably has an electron- or hole-transport function, as disclosed in US 2005/0109989 A1.

Other relevant materials, techniques, processes, applications and information on QD or nanorods which useful for the present invention have already been described in various publications, such as, for example, in WO 2011/147522, WO 2012/013270, EP 2494603, WO 2012/064562, US 2010/140551, US 2010/155749, KR 20100114757, US 2008/128688, TW 201213980, KR 20120062773, WO 2012/099653, CN 102047098, WO 2011/044391, WO 2010/014198, WO 2009/035657 etc. These are hereby incorporated in their entirety by way of reference.

HTMs or HIMs are materials which have hole-transporting or hole-injecting properties. Examples of such materials are: triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). These arylamines and heterocycles preferably result in an HOMO in the polymer of more than −5.8 eV (vs. vacuum level), particularly preferably of more than −5.5 eV.

ETMs and EIMs are materials which have electron-transporting or electron-injecting properties. Examples of such materials are: pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital). These units in the polymer preferably result in an LUMO of less than −2.5 eV (vs. vacuum level), particularly preferably of less than −2.7 eV.

HBMs are materials which block the formation of holes or suppress their transport. HBMs are frequently inserted between the light-emitting layer and the electron-transport layer in devices comprising phosphorescent emitters.

Suitable HBMs are metal complexes, such as, for example, BAlQ (=bis(2-methyl-8-quinolinolato)(4-phenylphenolato)aluminium(III)). Irppz (Ir(ppz)$_3$=fac-tris(1-phenylpyrazolato-N,C$^2$)iridium(III)) is likewise used for this purpose. Phenanthroline derivatives, such as, for example, BCP (=2,9-dimethyl-4,7-diphenyl-1,10-phenanthroline, = bathocuproin) or phthalimides, such as, for example, TMPP (=2,3,5,6-tetramethylphenyl-1,4-(bisphthalimide)) are likewise advantageously employed. Suitable HBMs are furthermore described in WO 00/70655 A2, WO 01/41512 and WO 01/93642 A1. Also suitable are triazine derivatives, spiro-oligophenylenes and ketones or phosphine oxides.

EBMs are materials which suppress or block the transport of electrons. Likewise, ExBMs are likewise materials which suppress or block the transport or formation of excitons. EBMs and ExBMs advantageously employed are transition-metal complexes, such as, for example, Ir(ppz)$_3$ (US 2003-0175553) and AlQ$_3$. Likewise suitable are arylamines, in particular triarylamines (for example described in US 2007-0134514 A1) and substituted triarylamines (for example MTDATA or TDATA (=4,4',4"-tris(N,N-diphenylamino)triphenylamine)), N-substituted carbazole compounds (for example TCTA), heterocyclic compounds (for example BCP) or tetraazasilane derivatives.

A light-emitting material is a material which preferably emits light in the visible region. The light-emitting material preferably has an emission maximum between 380 nm and 750 nm. The light-emitting material is preferably a phosphorescent or fluorescent emitter compound.

A fluorescent emitter compound in the sense of this invention is a compound which exhibits luminescence from an excited singlet state at room temperature. For the purposes of this invention, in particular all luminescent compounds which contain no heavy atoms, i.e. atoms having an atomic number greater than 36, are to be regarded as fluorescent compounds.

Preferred fluorescent emitter compounds are selected from the class of the monostyrylamines, the distyrylamines, the tristyrylamines, the tetra-styrylamines, the styrylphosphines, the styryl ethers and the arylamines.

A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. An arylamine or aromatic amine in the sense of this invention is taken to mean a compound which contains three substituted or unsubstituted aromatic or heteroaromatic ring systems bonded directly to the nitrogen. At least one of these aromatic or heteroaromatic ring systems is preferably a condensed ring system, preferably having at least 14 aromatic ring atoms. Preferred examples thereof are aromatic anthracenamines, aromatic anthracenediamines, aromatic pyrenamines, aromatic pyrenediamines, aromatic chrysenamines or aromatic chrysenediamines. An aromatic anthracenamine is taken to mean a compound in which one diarylamino group is bonded directly to an anthracene group, preferably in the 2- or 9-position. An aromatic anthracenediamine is taken to mean a compound in which two diarylamino groups are bonded directly to an anthracene group, preferably in the 2,6- or 9,10-position. Aromatic pyrenamines, pyrenediamines, chrysenamines and chrysenediamines are defined analogously thereto, where the diarylamino groups are preferably bonded to the pyrene in the 1-position or in the 1,6-position.

Further preferred fluorescent emitter compounds are selected from indenofluorenamines or indenofluorenediamines, benzoindenofluorenamines or benzoindenofluorenediamines, and dibenzoindenofluorenamines or dibenzoindenofluorenediamines.

Further preferred fluorescent emitter compounds are selected from derivatives of naphthalene, anthracene, tetracene, benzanthracene, benzophenanthrene, fluorene, fluoranthene, periflanthene, indenoperylene, phenanthrene, perylene, pyrene, chrysene, decacyclene, coronene, tetraphenylcyclopentadiene, pentaphenylcyclopentadiene, fluorene, spirofluorene, rubrene, coumarin pyran, oxazole, benzoxazole, benzothiazole, benzimidazole, pyrazine, cinnamic acid esters, diketopyrrolopyrrole, acridone and quinacridone.

Of the anthracene compounds, particular preference is given to 9,10-substituted anthracenes, such as, for example, 9,10-diphenylanthracene and 9,10-bis(phenylethynyl)anthracene. 1,4-Bis(9'-ethynylanthracenyl)benzene is also a preferred dopant. Preference is likewise given to derivatives of rubrene, coumarin, rhodamine, quinacridone, such as, for example, DMQA (=N,N'-dimethylquinacridone), dicyanomethylenepyran, such as, for example, DCM (=4-(dicyanoethylene)-6-(4-dimethylaminostyryl-2-methyl)-4H-pyran), thiopyran, polymethine, pyrylium and thiapyrylium salts, periflanthene and indenoperylene.

Blue fluorescent emitters are preferably polyaromatic compounds, such as, for example, 9,10-di(2-naphthylanthracene) and other anthracene derivatives, derivatives of tetracene, xanthene, perylene, such as, for example, 2,5,8,11-tetra-t-butylperylene, phenylene, for example 4,4'-(bis(9-ethyl-3-carbazovinylene)-1,1'-biphenyl, fluorene, fluoranthene, arylpyrenes, arylenevinylenes, bis(azinyl) imine-boron compounds, bis(azinyl)methene compounds and carbostyryl compounds.

Further preferred blue fluorescent emitters are described in C. H. Chen et al.: "Recent developments in organic electroluminescent materials" Macromol. Symp. 125, (1997) 1-48 and "Recent progress of molecular organic electroluminescent materials and devices" Mat. Sci. and Eng. R, 39 (2002), 143-222.

The light-emitting materials employed are particularly preferably phosphorescent emitter compounds. A phosphorescent emitter compound is generally taken to mean a compound which exhibits luminescence from an excited state having relatively high spin multiplicity, i.e. a spin state >1, such as, for example, from an excited triplet state (triplet emitter), from an MLCT mixed state or a quintet state (quintet emitter). Suitable phosphorescent emitter compounds are, in particular, compounds which emit light, preferably in the visible region, on suitable excitation and in addition contain at least one atom having atomic numbers >38 and <84, particularly preferably >56 and <80. Preferred phosphorescence emitters are compounds which contain copper, molybdenum, tungsten, rhenium, ruthenium, osmium, rhodium, iridium, palladium, platinum, silver, gold or europium, in particular compounds which contain iridium, platinum or copper. Examples of the emitters described above are revealed by the applications WO 00/70655, WO 01/41512, WO 02/02714, WO 02/15645, EP 1191613, EP 1191612, EP 1191614, WO 2005/033244. In general, all phosphorescent complexes as are used in accordance with the prior art for phosphorescent OLEDs and as are known to the person skilled in the art in the area of organic electroluminescence are suitable.

Organic metal complexes are taken to mean metal-ligand coordination compounds in which the ligand is an organic compound. In accordance with the invention, the metal complexes include all compounds which can be employed in organic electronic devices by a person skilled in the art in this area.

Particularly preferred organic electronic devices comprise, as phosphorescent emitter compounds, at least one metal complex of the formulae (1) to (4),

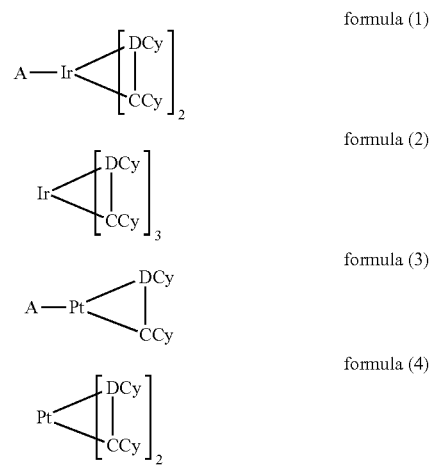

where:
DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$; the groups DCy and CCy are connected to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic, bidentate-chelating ligand, preferably a diketonate ligand; and R$^1$ is on each occurrence, identically or differently, H, a straight-chain, branched or cyclic alkyl or alkoxy radical having 1 or 3 to 22 C atoms respectively, in which, in addition, one or more non-adjacent C atoms may be replaced by N—R$^2$, O, S, O—CO—O, CO—O, —CR$^2$=CR$^2$—, —C≡C— and in which, in addition, one or more H atoms may be replaced by F, Cl, or CN, or an aryl, heteroaryl, aryloxy or heteroaryloxy group having 5 to 40 C atoms, which may also be substituted by one or more non-aromatic radicals R$^1$; R$^2$ is on each occurrence, identically or differently, H or a hydrocarbon radical having 1 to 20 C atoms;

A bridge may also be present between the groups DCy and CCy due to the formation of ring systems between a plurality of radicals R$^1$.

Examples of the emitters described above are revealed by the applications WO 2000/70655, WO 2001141512, WO 2002/02714, WO 2002/15645, EP 1191613, EP 1191612, EP 1191614, WO 2005/033244, WO 2005/019373, US 2005/0258742, WO 2009/146770, WO 2010/015307, WO 2010/031485, WO 2010/054731, WO 2010/054728, WO 2010/086089, WO 2010/099852 and WO 2010/102709. In general, all phosphorescent complexes as are used in accordance with the prior art for phosphorescent OLEDs and as are known to the person skilled in the art in the area of organic electroluminescence are suitable, and the person skilled in the art will be able to use further phosphorescent complexes without inventive step.

Examples of suitable phosphorescent compounds are indicated in the following table.

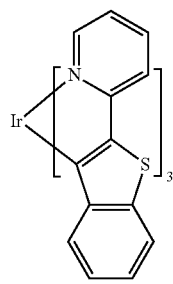

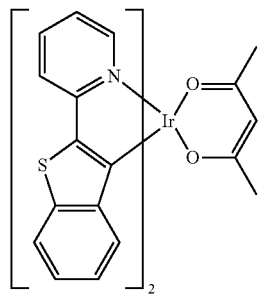

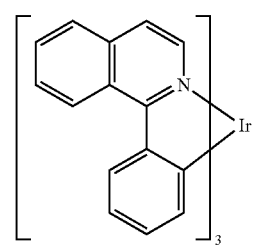

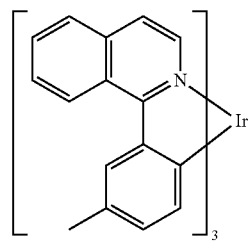

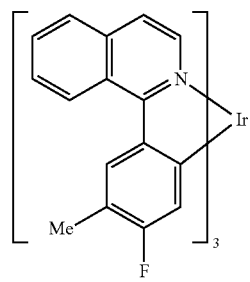

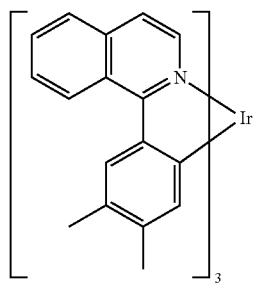

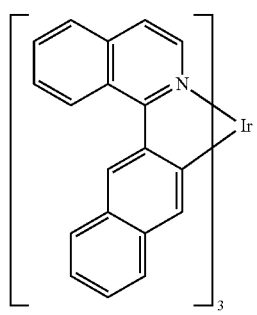

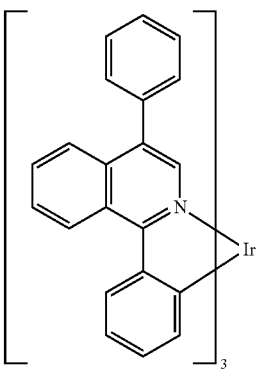

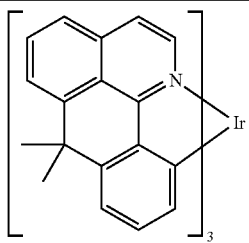
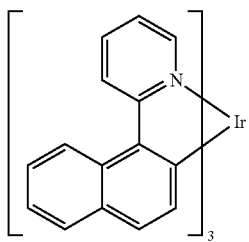
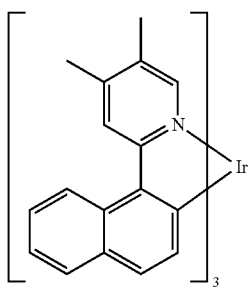
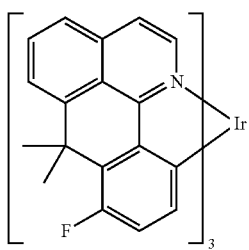
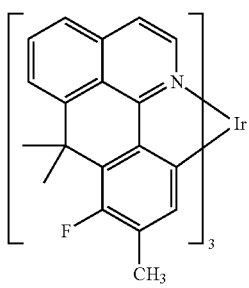
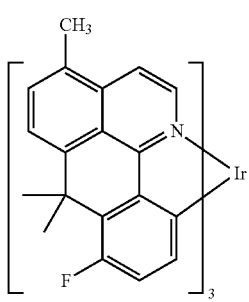
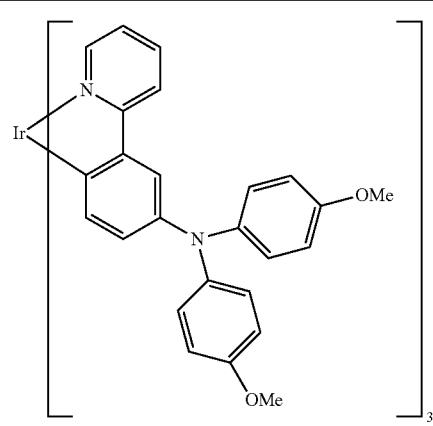
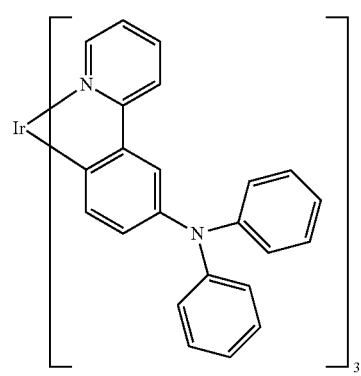
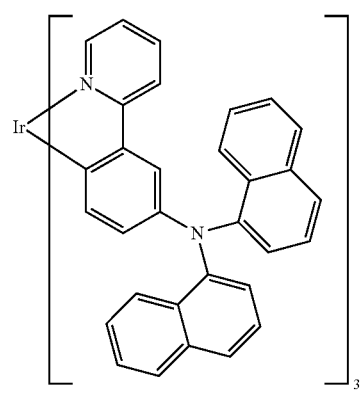
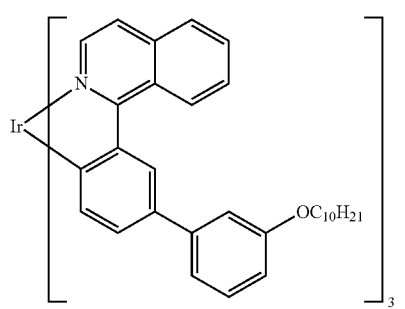

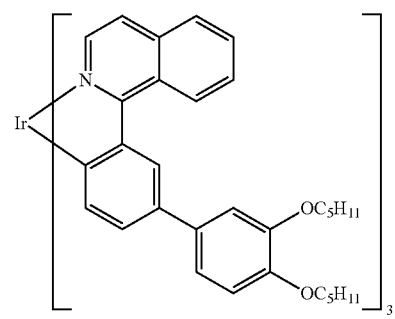
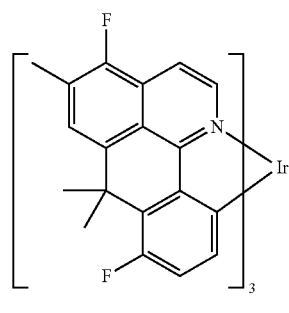
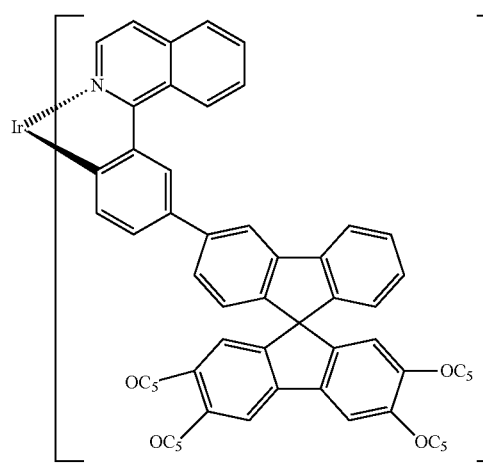
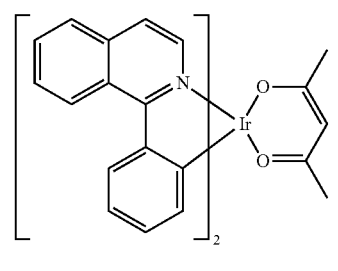
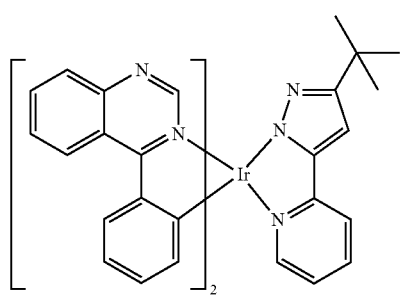
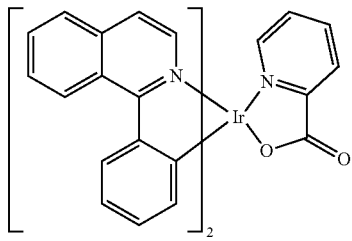
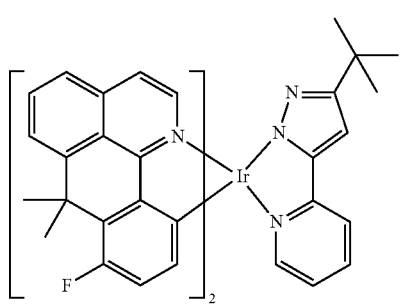
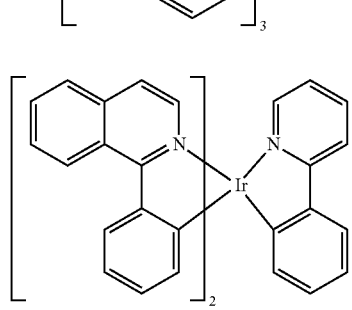

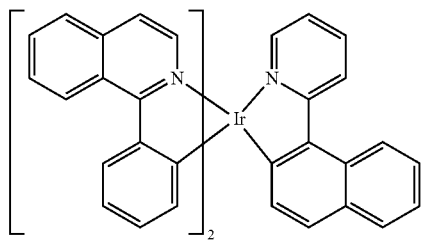
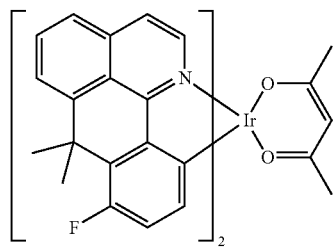
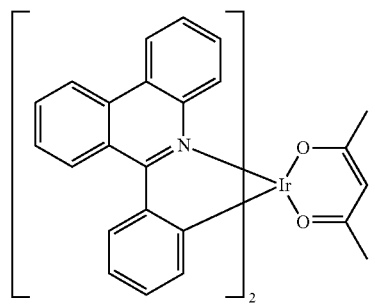
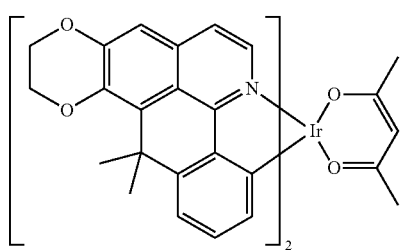
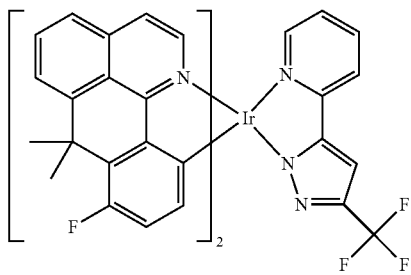
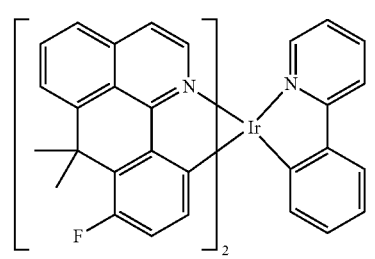
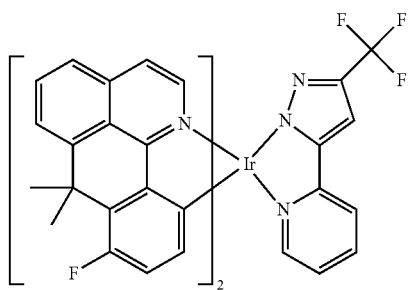
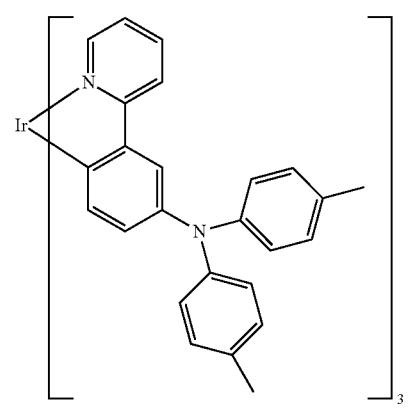
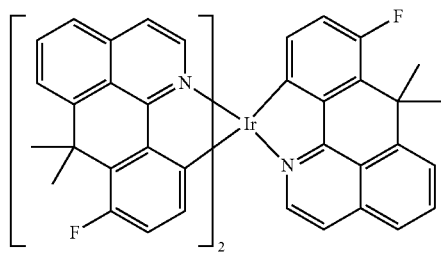
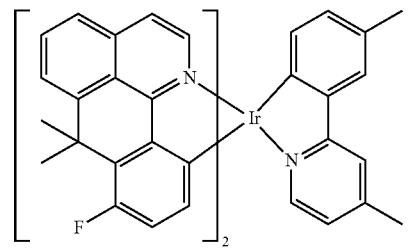
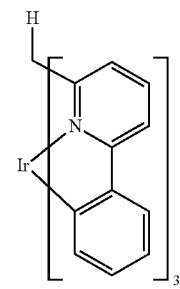

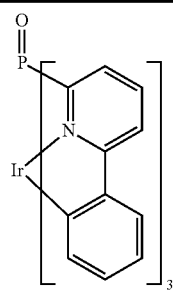
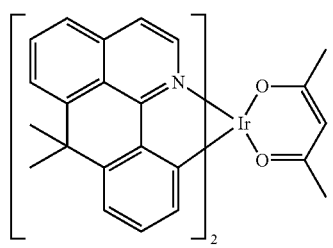
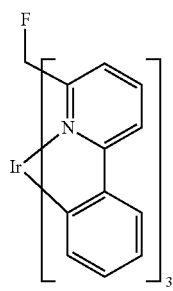
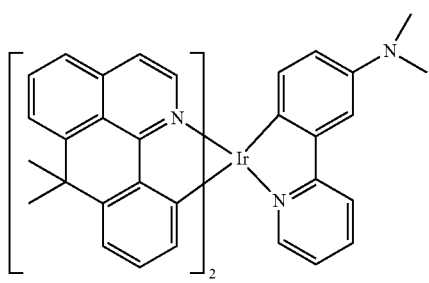
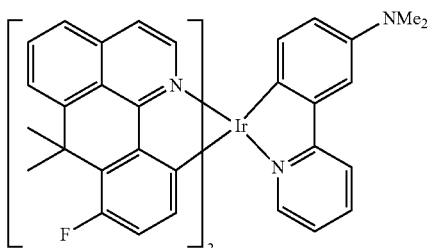
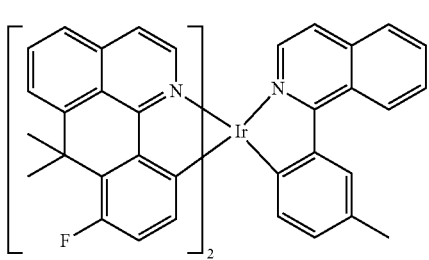
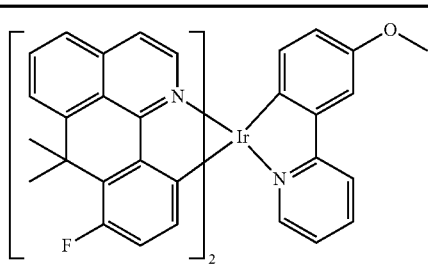
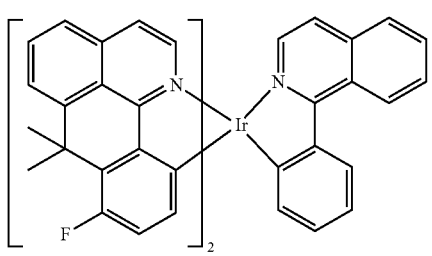
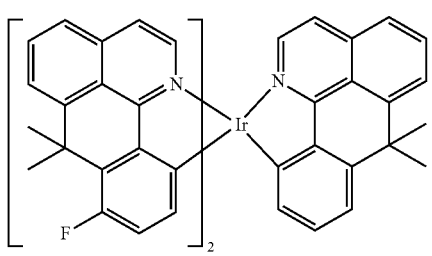
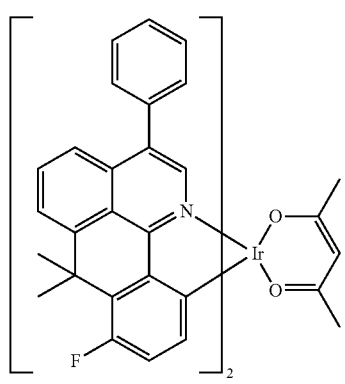

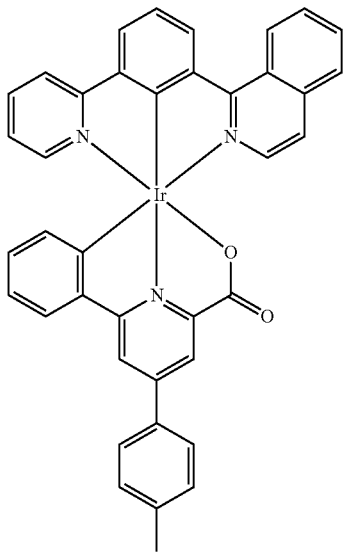
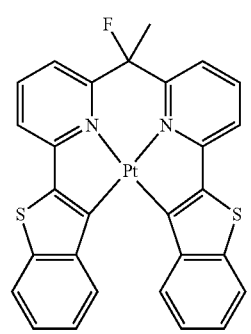
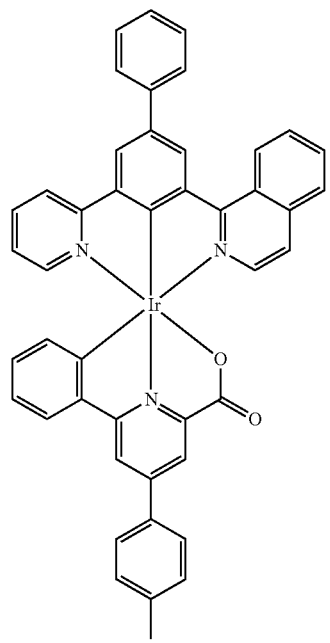
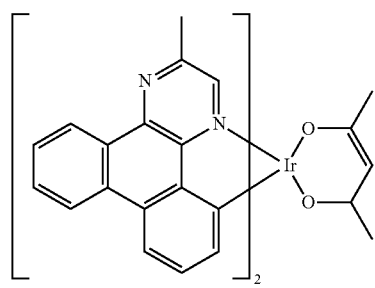
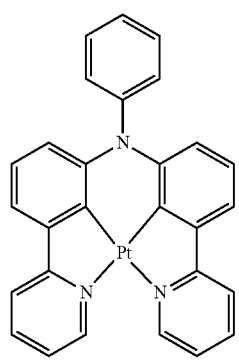
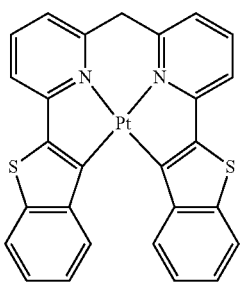
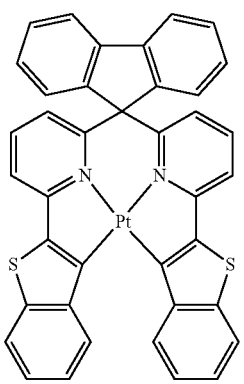
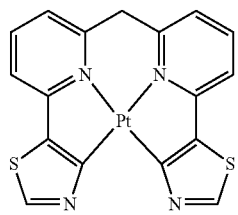

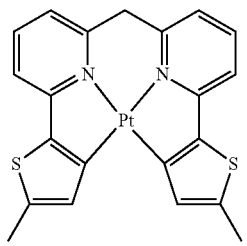
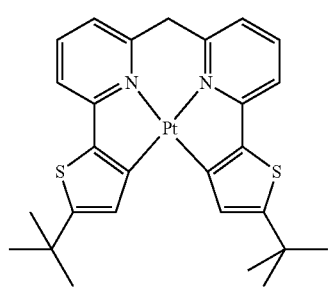
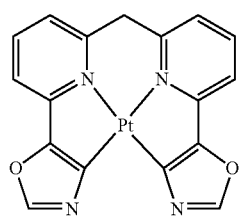
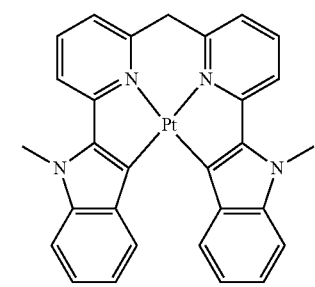
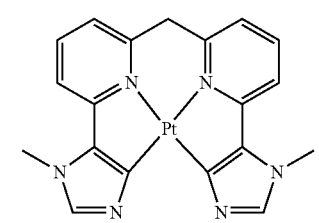
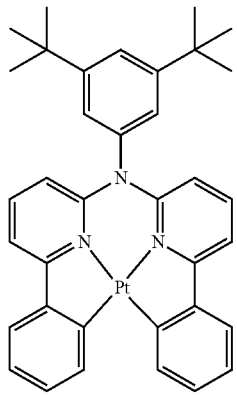
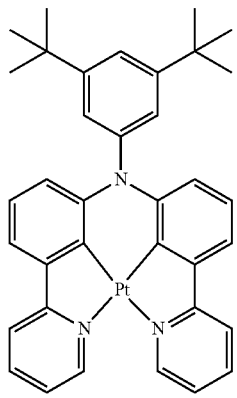
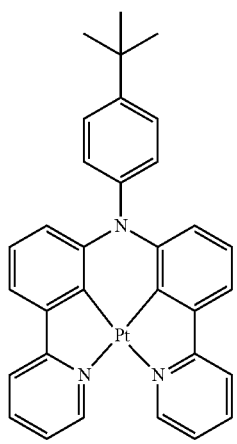
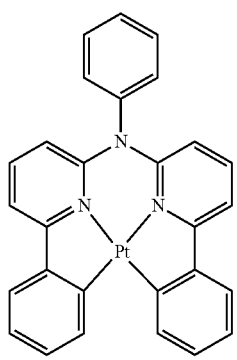

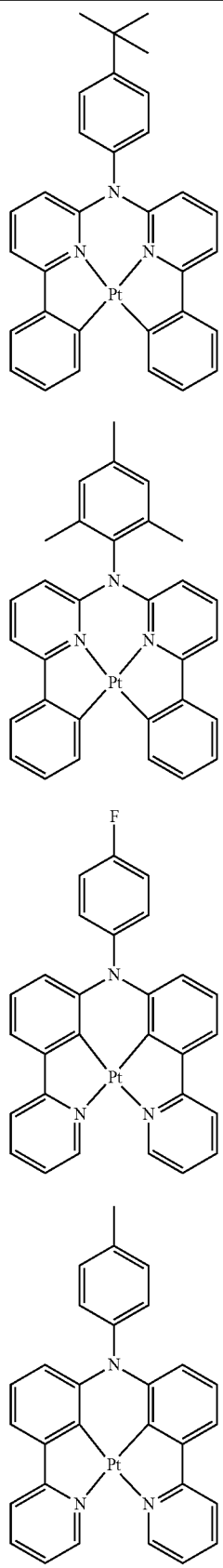
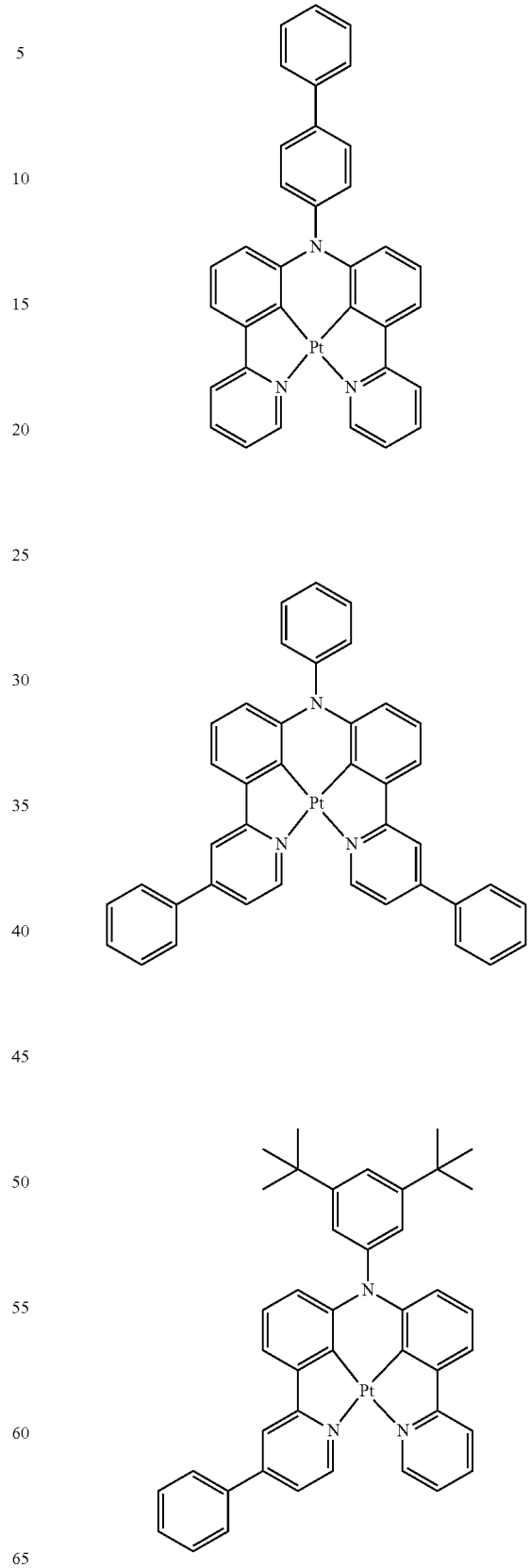

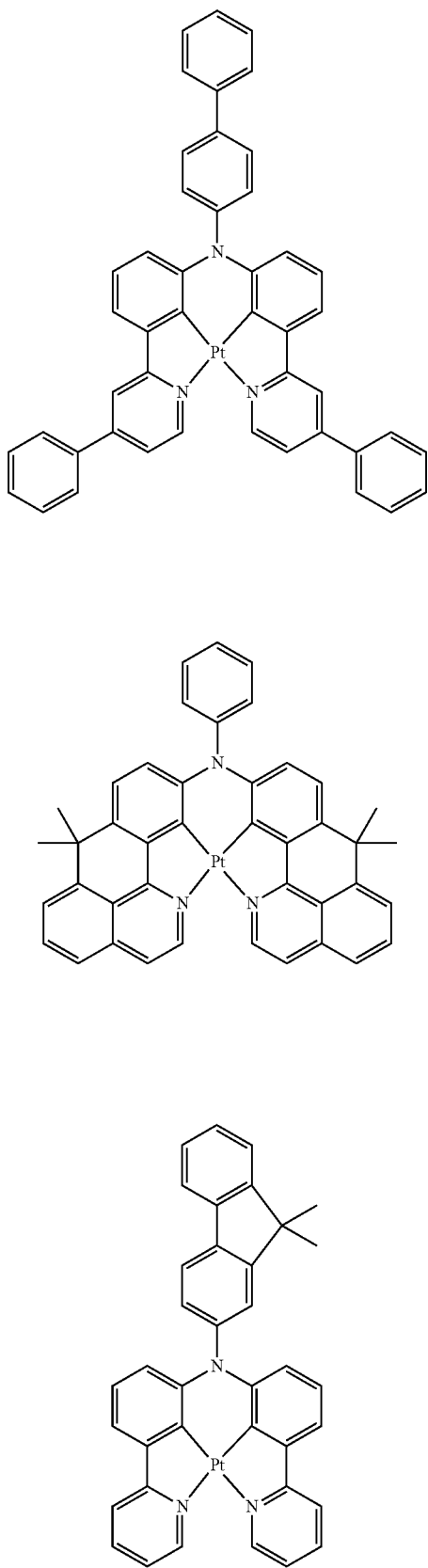
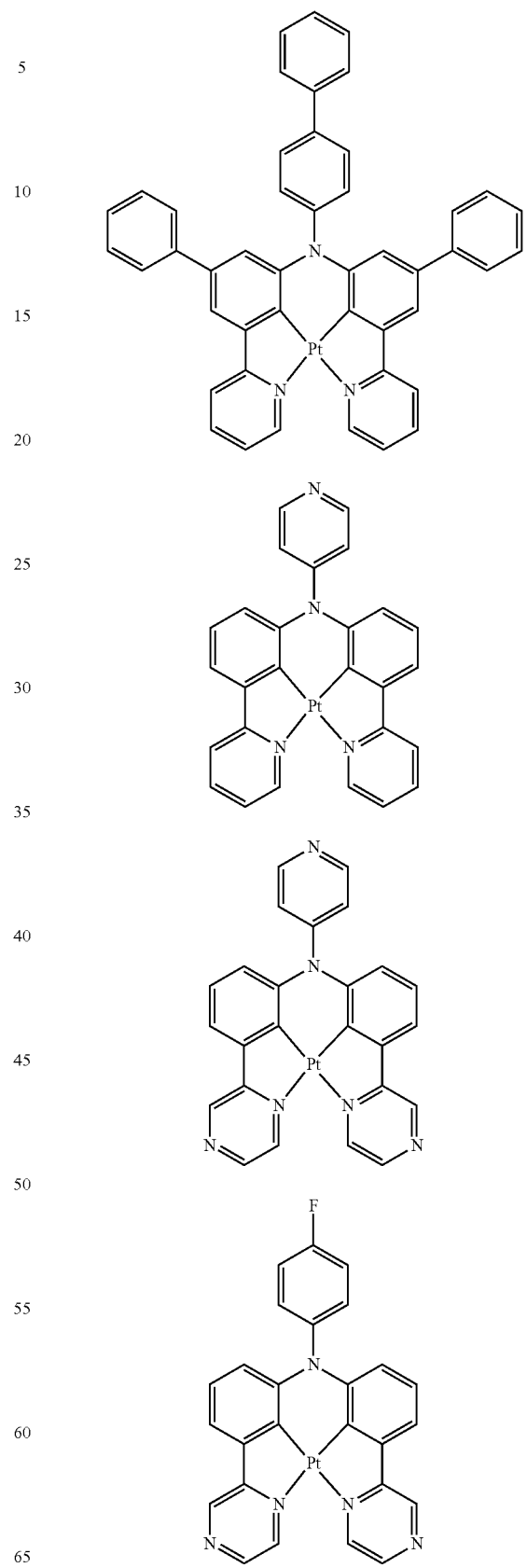

-continued
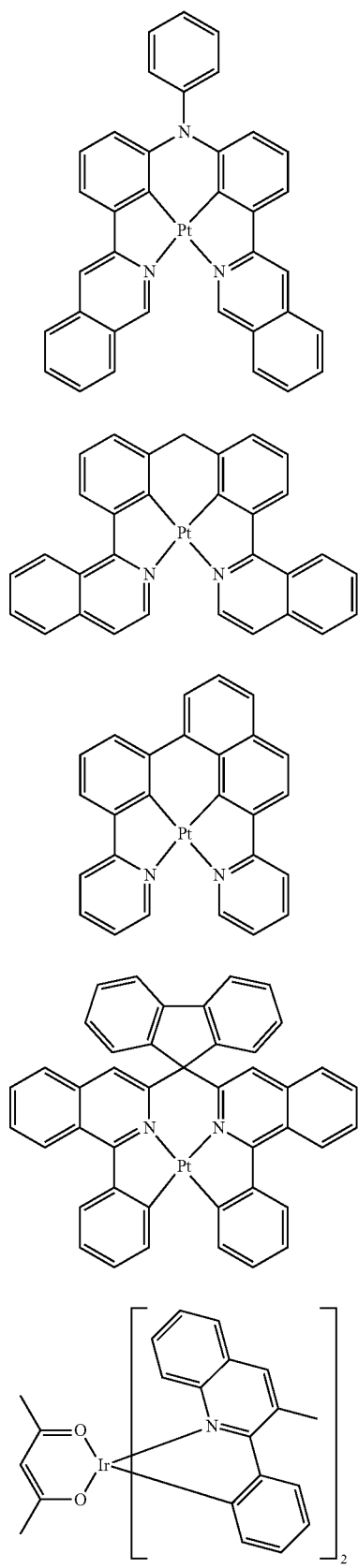
-continued
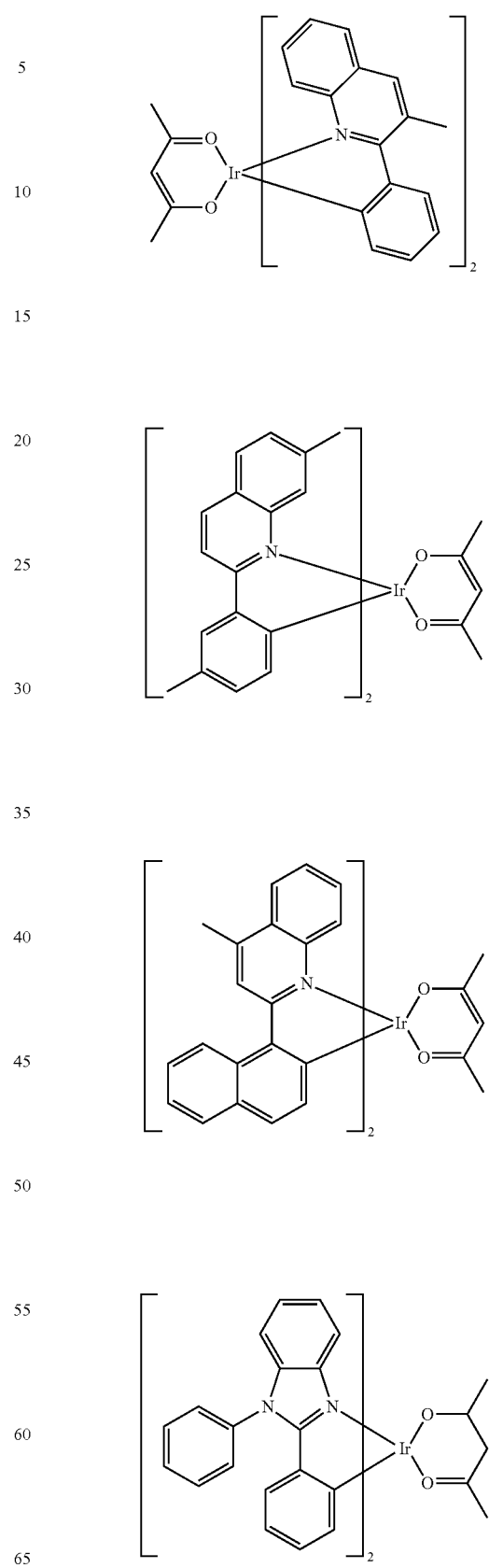

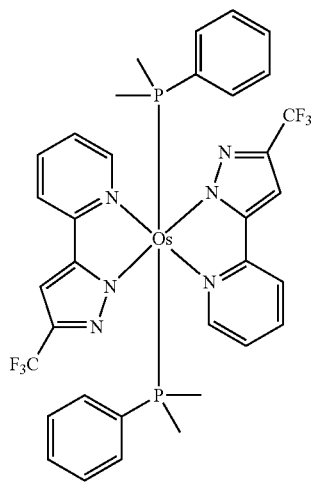
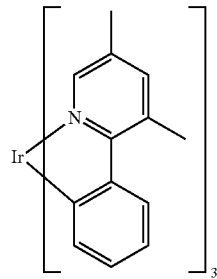
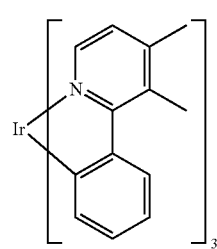
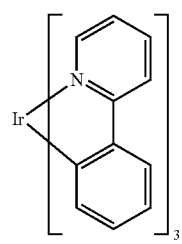
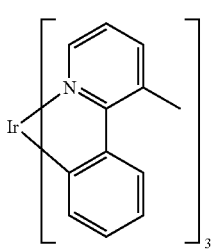
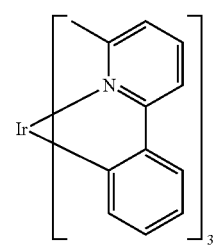
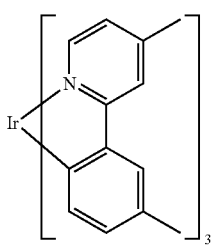
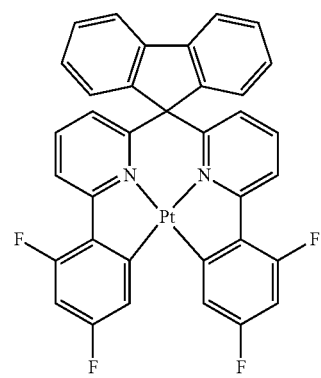
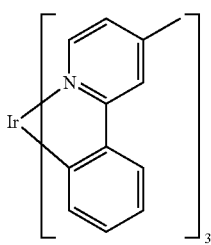
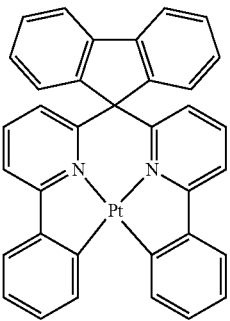

-continued
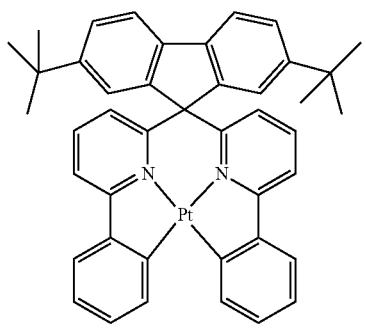
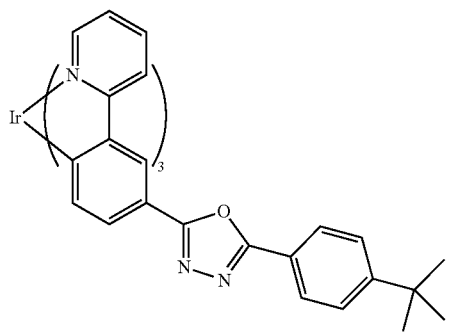
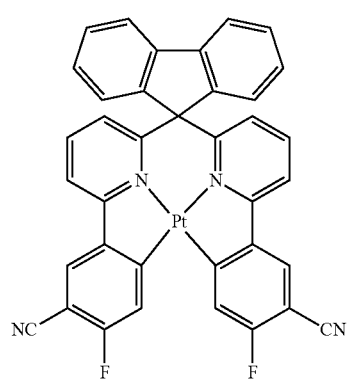
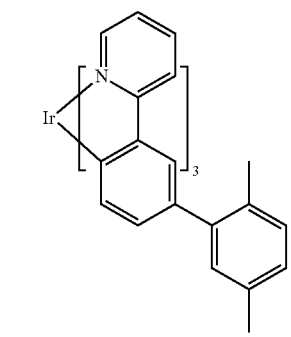
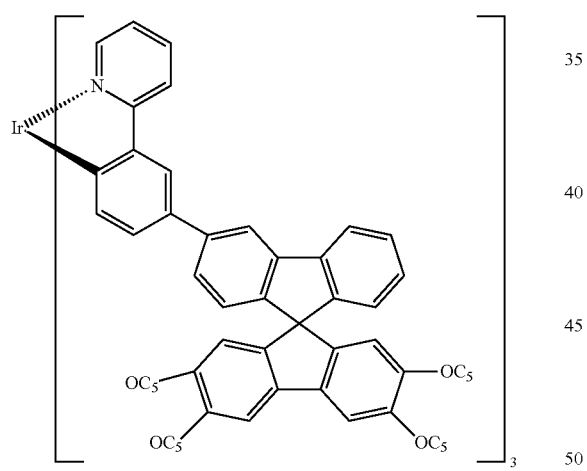
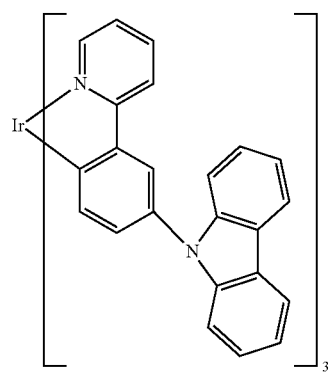
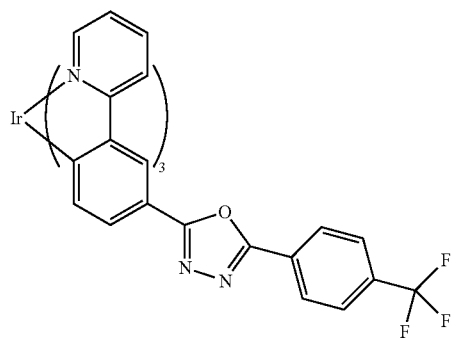
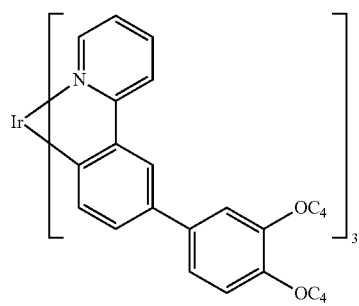

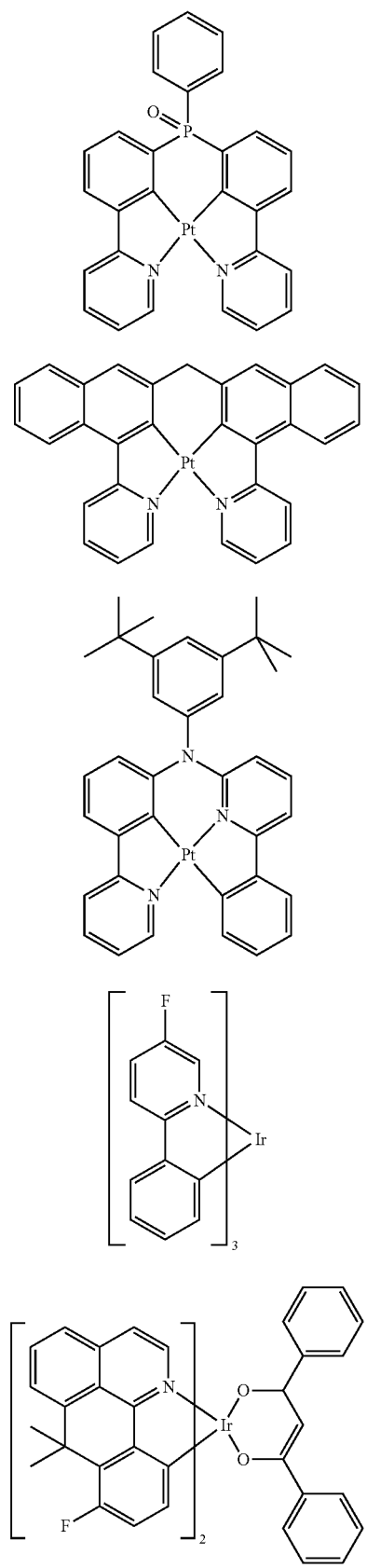
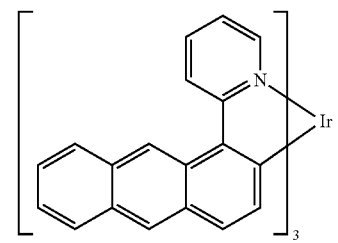
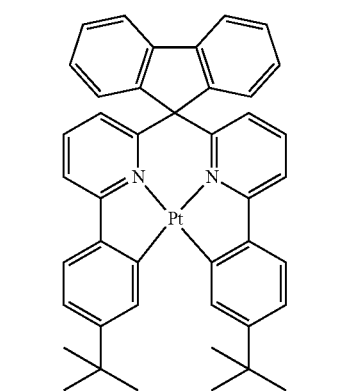
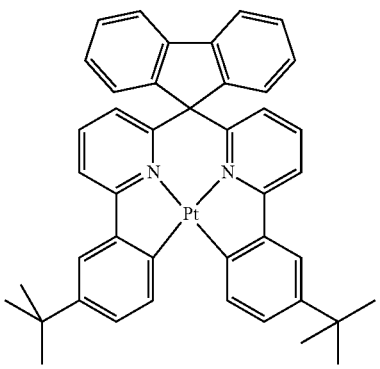
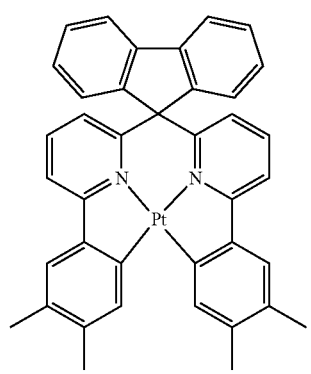

33
-continued
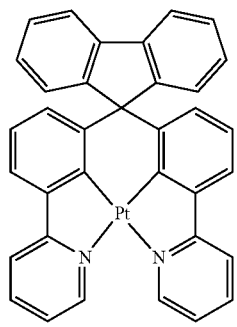
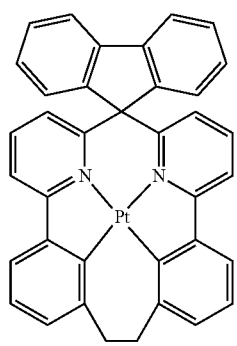
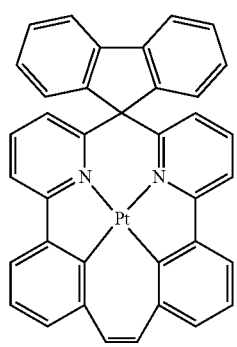
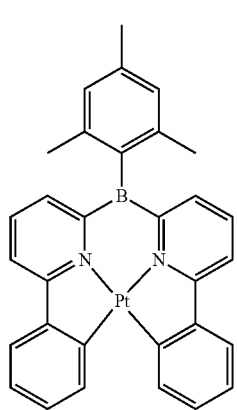
34
-continued
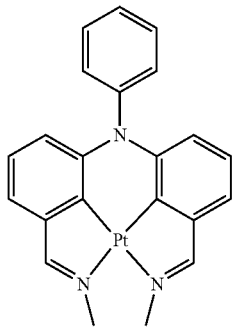
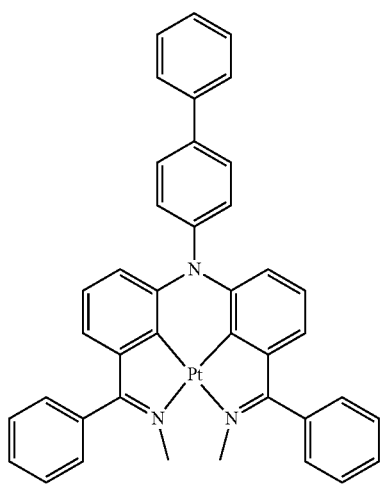
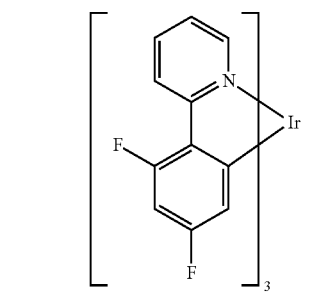
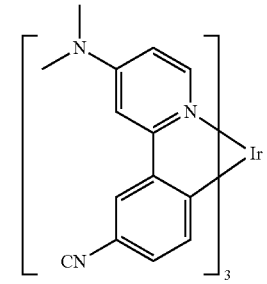

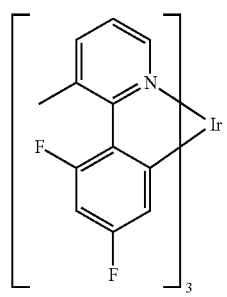
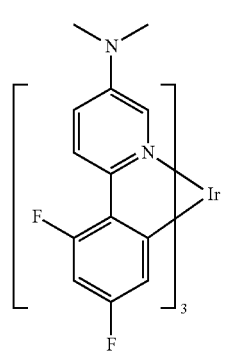
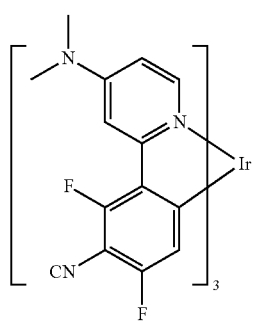
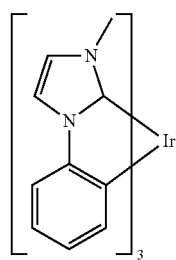
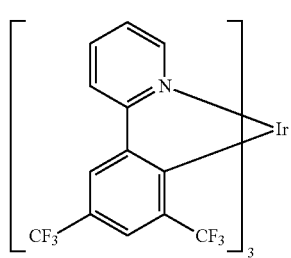
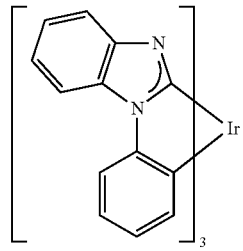
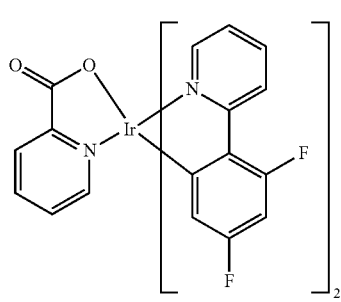
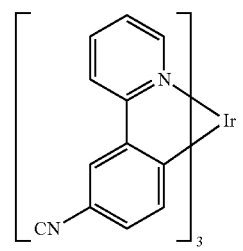
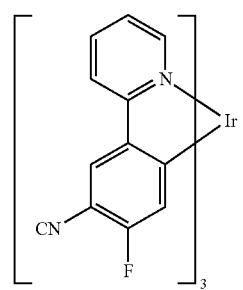
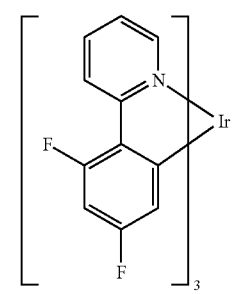

-continued
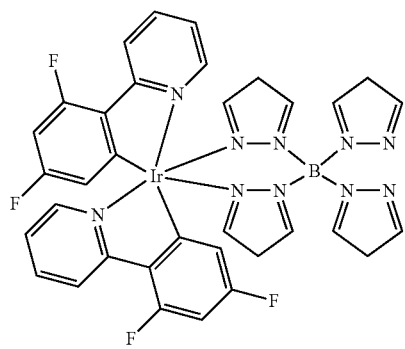
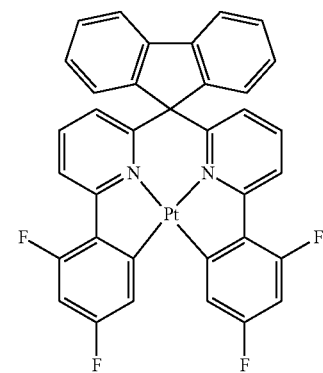
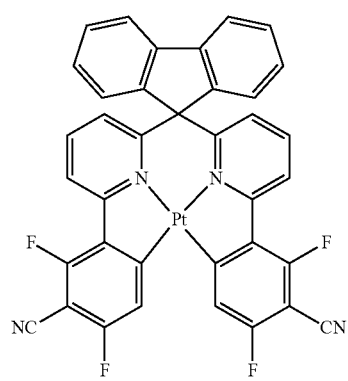
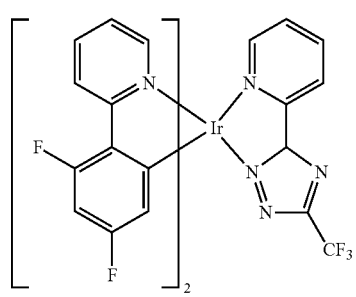
-continued
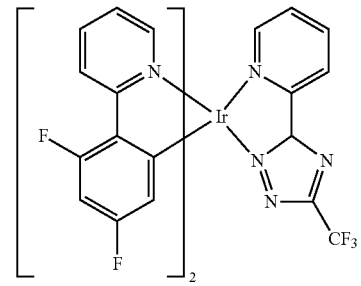
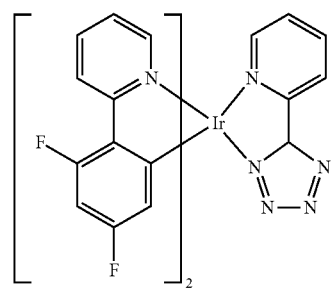
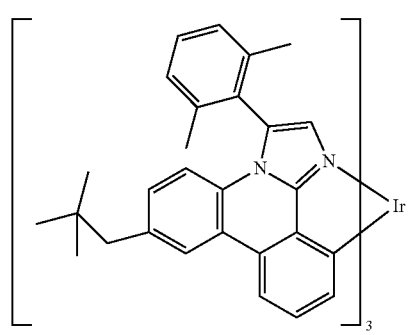
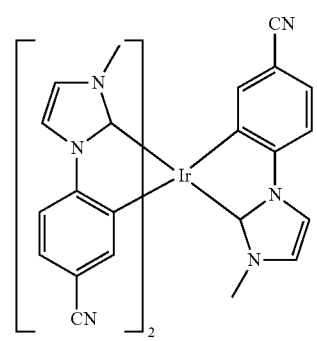
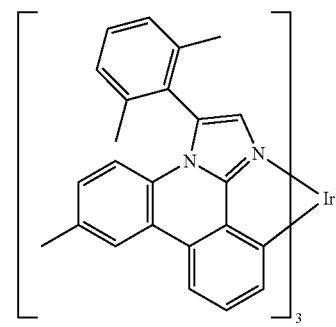

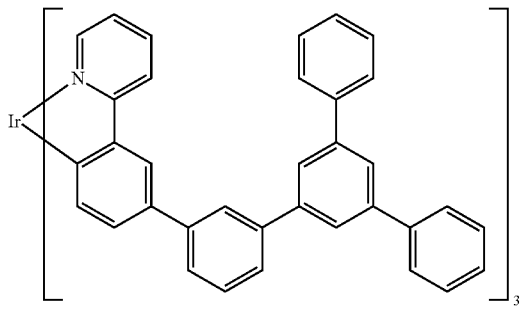

A host material is preferably a material which is employed as matrix for a light-emitting compound. Suitable host materials for fluorescent emitters are materials from various classes of substance. Preferred host materials are selected from the classes of the oligoarylenes (for example 2,2',7,7'-tetraphenylspirobifluorene or dinaphthylanthracene), in particular the oligoarylenes containing condensed aromatic groups, such as, for example, anthracene, benzanthracene, benzophenanthrene, phenanthrene, tetracene, corones, chrysene, fluorene, spirofluorene, perylene, phthaloperylene, naphthaloperylene, decacyclene, rubrene, the oligoarylenevinylenes (for example DPVBi=4,4'-bis(2,2-diphenylethenyl)-1,1'-biphenyl) or spiro-DPVBi in accordance with EP 676461), the polypodal metal complexes, in particular metal complexes of 8-hydroxyquinoline, for example AlQ$_3$ (=aluminium(III) tris(8-hydroxyquinoline)) or bis(2-methyl-8-quinolinolato)-4-(phenylphenolinolato)aluminium, also with imidazole chelate and the quinoline-metal complexes, aminoquinoline-metal complexes, benzoquinoline-metal complexes, the hole-conducting compounds, the electron-conducting compounds, in particular ketones, phosphine oxides, sulfoxides, etc., the atropisomers, the boronic acid derivatives or the benzanthracenes.

Particularly preferred host materials for fluorescent emitters are selected from the classes of the oligoarylenes, comprising anthracene, benzanthracene and/or pyrene or atropisomers of these compounds. An oligoarylene in the sense of this invention is intended to be taken to mean a compound in which at least three aryl or arylene groups are bonded to one another. Further preferred compounds are derivatives of arylamine, styrylamine, fluorescein, diphenylbutadiene, tetraphenylbutadiene, cyclopentadienes, tetraphenylcyclopentadiene, pentaphenylcyclopentadiene, coumarin, oxadiazole, bisbenzoxazoline, oxazole, pyridine, pyrazine, imine, benzothiazole, benzoxazole, benzimidazole, for example 2,2',2"-(1,3,5-phenylene)tris[1-phenyl-1H-benzimidazole], aldazine, stilbene, styrylarylene derivatives, for example 9,10-bis[4-(2,2-diphenylethenyl)phenyl]anthracene and distyrylarylene derivatives, diphenylethylene, vinylanthracene, diaminocarbazole, pyran, thiopyran, diketopyrrolopyrrole, polymethine, cinnamic acid esters and fluorescent dyes.

Particularly preferred for fluorescent emitters are derivatives of arylamine and styrylamine, for example TNB (=4,4'-bis[N-(1-naphthyl)-N-(2-naphthyl)-amino]biphenyl).
Metal oxinoid complexes, such as LiQ or AlQ$_3$, can be used as co-hosts.

Host materials which can be employed for phosphorescent emitters are the following: CBP (N,N-biscarbazolylbiphenyl), carbazole derivatives, azacarbazoles, ketones, phosphine oxides, sulfoxides and sulfones, oligophenylenes, aromatic amines, bipolar matrix materials, silanes, 9,9-diarylfluorene derivatives, azaboroles or boronic esters, triazine derivatives, indolocarbazole derivatives, indenocarbazole derivatives, diazaphosphole derivatives, triazole derivatives, oxazoles and oxazole derivatives, imidazole derivatives, polyarylalkane derivatives, pyrazoline derivatives, pyrazolone derivatives, distyrylpyrazine derivatives, thiopyran dioxide derivatives, phenylenediamine derivatives, tertiary aromatic amines, styrylamines, amino-substituted chalcone derivatives, indoles, hydrazone derivatives, stilbene derivatives, silazane derivatives, aromatic dimethylidene compounds, carbodiimide derivatives, metal complexes of 8-hydroxyquinoline derivatives, such as, for example, AlQ$_3$, the 8-hydroxyquinoline complexes may also contain triarylaminophenol ligands, metal complex/polysilane compounds and thiophene, benzothiophene and dibenzothiophene derivatives. The materials can be used as pure materials or doped, such as, for example, CBP intrinsic or doped with BczVBi (=4,4'-(bis(9-ethyl-3-carbazovinylene)-1,1'-biphenyl). It is furthermore preferred to use mixtures of two or more of the above-mentioned matrix materials, in particular mixtures of an electron-transporting material and a hole-transporting material. Examples of preferred carbazole derivatives are mCP (=1,3-N,N-dicarbazolebenzene (=phenylene)bis-9H-carbazole)), CDBP (=9,9'-(2,2'-dimethyl[1,1'-biphenyl]-4,4'-diyl)bis-9H-carbazole), 1,3-bis(N,N'-dicarbazole)benzene (=1,3-bis(carbazol-9-yl)benzene), PVK (polyvinylcarbazole), 3,5-di(9H-carbazol-9-yl)biphenyl.

Further examples of matrix materials for the formulation according to the invention are ketones, phosphine oxides, sulfoxides and sulfones, for example in accordance with WO 2004/013080, WO 2004/093207, WO 2006/005627 or WO 2010/006680, triarylamines, carbazole derivatives, for example CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example in accordance with WO 2007/063754 or WO 2008/056746, indenocarbazole derivatives, for example in accordance with WO 2010/136109 or WO 2011/000455, azacarbazoles, for example in accordance with EP 1617710, EP 1617711, EP 1731584, JP 2005/347160, bipolar matrix materials, for example in accordance with WO 2007/137725, silanes, for example in accordance with WO 2005/111172, azaboroles or boronic esters, for example in accordance with WO 2006/117052, diazasilole derivatives, for example in accordance with WO 2010/054729, diazaphosphole derivatives, for example in accordance with WO 2010/054730, triazine derivatives, for example in accordance with WO 2010/015306, WO 2007/063754 or WO 2008/056746, zinc complexes, for example in accordance with EP 652273 or WO 2009/062578, dibenzofuran derivatives, for example in accordance with WO 2009/148015, or bridged carbazole derivatives, for example in accordance with US 2009/0136779, WO 2010/050778, WO 2011/042107 or WO 2011/088877.

It may also be preferred to employ a plurality of different matrix materials as mixture, in particular at least one electron-conducting matrix material and at least one hole-conducting matrix material. A preferred combination is, for example, the use of an aromatic ketone, a triazine derivative or a phosphine oxide derivative with a triarylamine derivative or a carbazole derivative or a fluorene derivative as mixed matrix for the metal complex according to the invention. Preference is likewise given to the use of a mixture of a charge-transporting matrix material and an electrically inert matrix material which is not or not significantly involved in the charge transport, as described, for example, in WO 2010/108579.

In accordance with the invention, the following host materials are particularly preferred:

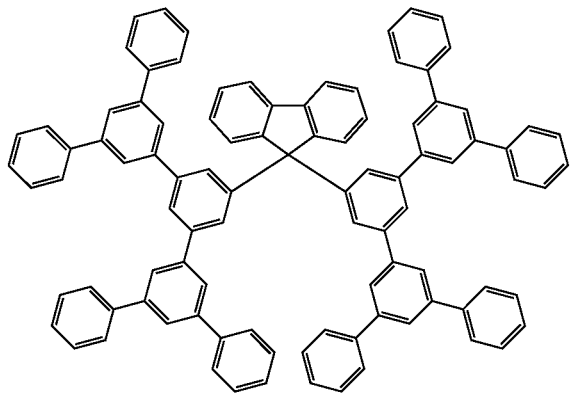

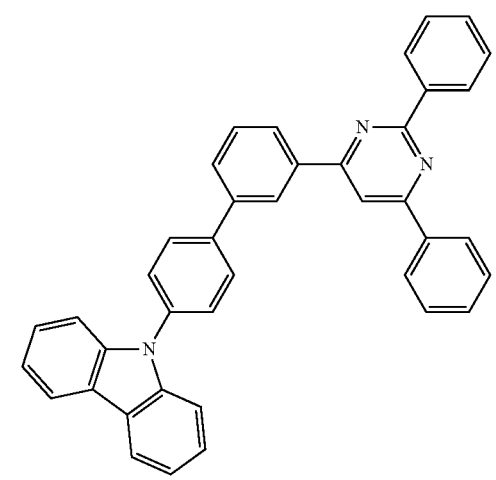

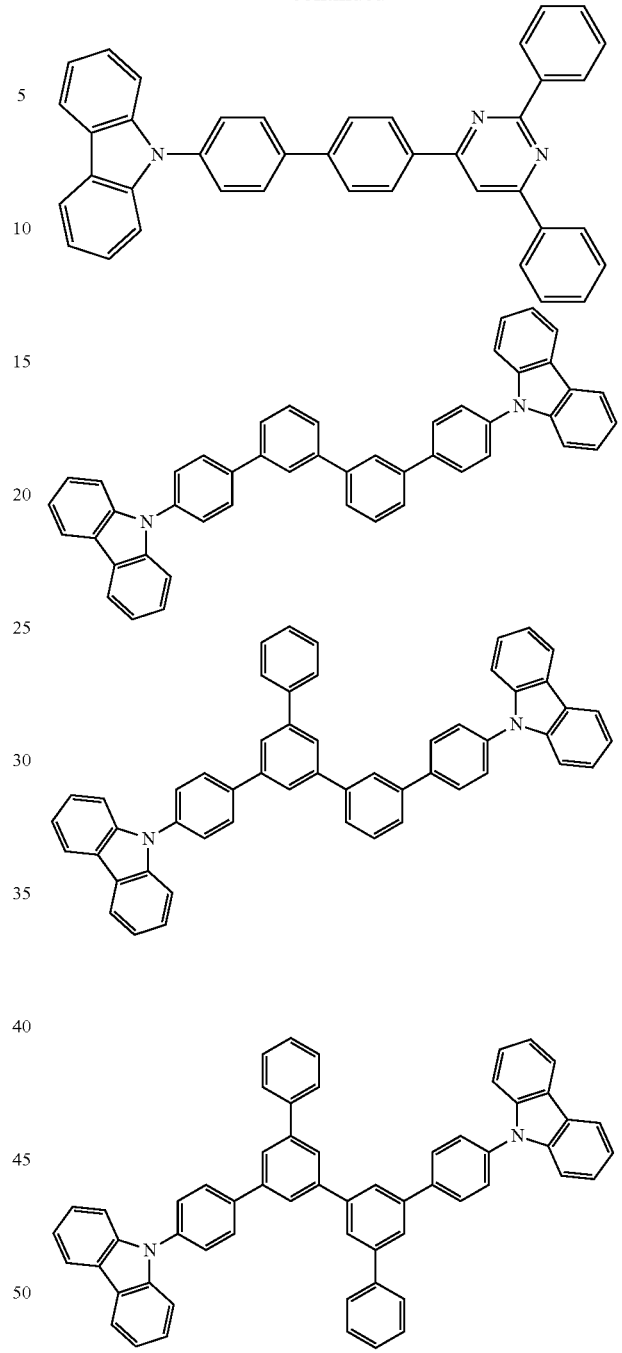

"Dyes" are taken to mean compounds which absorb a part of visible white light. The colour absorption in dyes is usually based on many conjugated double bonds and aromatic skeletons. On absorption, the conjugated electrons in the double-bond system are raised to a higher energy state and the dye molecule releases the energy again, either by radiation having a different wavelength, by dissociation to give a free electron-hole pair or by emission of heat.

Examples of dyes are absorber materials for organic solar cells or the metal complex dye for dye-sensitised solar cells. The preferred metal complex dye selected is a polypyridyl complex of transition metals, preferably ruthenium, osmium and copper. In a preferred embodiment, the metal complex dye will have the general structure $ML_2(X)_2$, in which L is preferably selected from a 2,2'-bipyridyl-4,4'-dicarboxylic acid, M is a transition metal preferably selected from Ru, Os, Fe, V and Cu, and X is selected from the groups comprising a halide, cyanide, thiocyanate, acetylacetonate, thiacarbamate or water substituent. Metal complex dyes of this type are disclosed, for example, in J. Phys. Chem. C (2009), 113, 2966-2973, US 2009/000658, WO 2009/107100, WO 2009/098643, U.S. Pat. No. 6,245,988, WO 2010/055471, JP 2010084003, EP 1622178, WO 9850393, WO 9529924, WO 9404497, WO 9214741 and WO 9116719.

In an embodiment of the present invention, the functional organic material in the formulation according to the invention is a hole-transport material, a light-emitting material, a host material, an electron-transport material or a combination thereof. Particular preference is given here to a combination of a light-emitting material and a host material.

The formulation according to the invention can be in the form of a solution, emulsion or dispersion. An emulsion is taken to mean a finely divided mixture of two normally immiscible liquids without visible separation. The emulsion may also be a miniemulsion or nanoemulsion, which are taken to mean emulsions which are thermodynamically stable. These emulsions are optically transparent and form without the high supply of energy which is otherwise necessary for the preparation of emulsions. For the preparation of a microemulsion or nanoemulsion, use is usually made of co-surfactants or co-solvents. Emulsions comprising two solvents are employed, in particular, if the substances to be dissolved have better solubility therein. A dispersion is taken to mean a heterogeneous mixture of at least two substances which do not or scarcely dissolve in one another or bond chemically to one another. In general, these are colloids. The nanocrystal or the functional organic material (dispersed phase) here is very finely distributed in the solvent (dispersion medium).

More on emulsion and dispersion and uses thereof in organic electronic devices has already been described in various publications, such as, for examples, WO 2011/076323, WO 2011/076314, WO 2011/076326 etc. These are hereby incorporated in their totally by way of reference.

The inert gas used for the supersaturation of the solvent of the formulation according to the invention is preferably $N_2$, a noble gas, $CO_2$ or a combination thereof. The noble gas used is preferably helium, neon or argon, where argon is particularly preferred.

It is furthermore preferred for the content of inorganic, non-metallic impurities in the solvent to be less than 500 ppm, more preferably 300 ppm, even more preferably 200 ppm and most preferably 100 ppm. Inorganic, non-metallic impurities are taken to mean all inorganic compounds which do not contain metals. In accordance with the invention, this means, in particular, halogens or halides.

In addition, the content of metallic impurities in the solvent is preferably less than 500 ppm, more preferably 300 ppm, even more preferably 200 ppm and most preferably 100 ppm, where a metal atom is intended to be counted as a particle.

The content of $O_2$ and $H_2O$ in the solvent taken together is preferably less than 500 ppm, more preferably less than 300 ppm, even more preferably less than 100 ppm, furthermore preferably less than 50 ppm and most preferably less than 20 ppm.

Furthermore, the purity of the solvent is preferably at least 99.8% by weight, more preferably 99.9% by weight.

The purity of the solvent can be determined via HPLC-MS analysis.

The at least one solvent employed in the formulation according to the invention is preferably selected from the group consisting of optionally substituted aromatic or heteroaromatic hydrocarbon compounds, dialkylformamides, aliphatic linear, branched or heteroaliphatic cyclic hydrocarbons and mixtures thereof.

Organic solvents which can be used are dichloromethane, trichloromethane, monochlorobenzene, o-dichlorobenzene, tetrahydrofuran, anisole, mesitylene, morpholine, toluene, o-xylene, m-xylene, p-xylene, 1,4-dioxane, acetone, methyl ethyl ketone, 1,2-dichloroethane, 1,1,1-trichloroethane, 1,1,2,2-tetrachloroethane, ethyl acetat, n butyl acetate, dimethylacetamide, tetralin, decalin, indane, cyclohexanone, dimethylformamide (DMF), dimethyl sulfoxide (DMSO), propylene carbonate, dichloromethane (DCM), tetrahydrofuran (THF), ethyl acetate, acetone, acetonitrile, formic acid, n-butanol, isopropanol, n-propanol, acetic acid, ethanol, methanol or also mixtures thereof.

The optionally substituted aromatic or heteroaromatic hydrocarbon compound is preferably selected from the group consisting of toluene, xylene, anisole and other phenol ethers, pyridine, pyrazine, chlorobenzene, dichlorobenzene, trichlorobenzene, and derivatives thereof.

Dialkylformamides are taken to mean compounds which are substituted on the amide nitrogen by two alkyl groups, where methyl and ethyl are preferred as alkyl groups. Examples are dimethylformamide (DMF), N-methyl-pyrrolidones (NMP), dimethylacetamide (DMAC) and derivatives thereof.

Of the aliphatic linear, branched or cyclic hydrocarbons, preference is given to the following: cyclohexanone, propylene carbonate, dichloromethane (DCM), tetrahydrofuran (THF), ethyl acetate, acetone, acetonitrile, formic acid, n-butanol, isopropanol, n-propano, acetic acid, ethanol, methanol, pyrrolidones and derivatives thereof.

The solvent employed in the formulation according to the invention is preferably freed as far as possible from impurities before use. This can be accomplished by recrystallisation at low temperatures, vacuum evaporation, distillation or extraction.

However, the freeing of the solvent from dissolved gaseous molecules, such as, for examples, oxygen, or water is preferably carried out by passing inert gas through the solvent. In this way, saturation or supersaturation of the solvent with the inert gas also occurs. The inert gases mentioned above are preferably used here. In accordance with the invention, "supersaturated" means that at least 90% of the dissolved gases, more preferably at least 95% and most preferably at least 99%, in the solvent are inert gases, and the gas absorption capacity for inert gas in the solvent is preferably also exhausted to the extent of at least 95%, more preferably at least 99%.

In an embodiment, the saturated or supersaturated solvents or formulation can be generated under inert-gas atmosphere using high pressure, for example by compression.

The solubility of noble gases in solvents can be determined by means of headspace gas chromatography (HS-GC).

The analytical method gas chromatography (GC) is taken to mean an analytical separation method for the qualitative and quantitative determination of volatile compounds or gases. In this method, the sample is, if necessary, evaporated via an injector and applied to a chromatographic separating column. For direct introduction of the sample into the gas chromatographs, ready volatility and stability of the sample constituents at the temperatures prevailing in the GC must be presupposed. The chromatographic column represents the so-called stationary phase. The analytes present in the mobile phase can interact therewith to different extents and consequently leave the column again separately at different retention times. The mobile phase is provided by an inert gas flowing through the column. Depending on the analytes to be detected, the column exit is connected to a suitable detector which records the substances and enables quantification of the analytes in the sample via calibration with suitable standards. A simple way of separating off volatile constituents from the non-volatile or only low-volatility matrix is the so-called headspace technique. In this, the sample is located in an analysis vessel which is sealed by a septum. An equilibrium of the volatile constituents between gas space and sample which depends on the nature and concentration of the analytes becomes established in the headspace above the sample at temperatures which are elevated in practice. With the aid of a gas-tight syringe, an aliquot of the headspace above the sample is taken and injected directly into the injector of the gas chromatograph. This enables trace matrix separation to be achieved, which enables sensitive analysis without exposing the gas chromatograph to the non-volatile sample constituents, some of which are harmful to the system. In this way, gases dissolved in liquids can also be analysed. In general, packed columns are preferred here over the fused silica columns often used today. They are frequently filled with molecular sieves in order to ensure separation of the gases from one another. Detectors here in the determination of noble gases can be, inter alia, mass spectrometers or thermal conductivity detectors. Volatility of the analytes and slight contamination by the environment must be taken into account. The poor solubility of the gases in liquids can frequently result in a sensitivity problem. Calibration standards can be prepared by saturation of the sample with the gas to be determined and by complete degassing of the solutions under controlled conditions. Knowledge of the solubility under given conditions must be available in this approach. The signal obtained for the sample to be analysed is compared with the signals of the calibration standards described above. Another possibility arises if it is assumed that the solubility of the gases in the liquid to be analysed approaches zero at elevated temperatures.

In this case, the sample is brought into thermal equilibrium at elevated temperatures (for example 80-120° C.), and the gas space is analysed. The signal obtained can be compared with the signal of a known gas mixture. Ideally, a mixture of the analyte gas in for the concentration to be expected in the sample in the mobile phase employed in each case, for example He, is used here.

Accordingly, the present invention also relates to a process for the preparation of a formulation according to the invention in which, in a first step, the nanocrystal or the functional organic material is dissolved in a solvent and, in a second step, is degassed using the inert gas. Between these steps, stirring is preferably carried out until a clear solution, miniemulsion or nanoemulsion is obtained. In order to free this solution from any undissolved impurities, it can be filtered through a filter before or after the degassing.

The present invention also relates to a process for the production of an organic electronic device using a formulation according to the invention. The formulations according to the invention are preferably used here in order to produce thin layers, for example by area-coating processes (for example spin coating) or by printing processes (for example ink-jet printing). The formulation according to the invention is particularly suitable for the production of films or coatings, in particular for the production of structured coatings, for example by thermal or light-induced crosslinking of crosslinkable groups.

The present invention also relates to an organic electronic device which has been produced by the process according to the invention.

The organic electronic device is preferably selected from the group consisting of organic or polymeric organic electroluminescent devices (OLED, PLED), organic field-effect transistors (OFETs), organic integrated circuits (OICs), organic thin-film transistors (OTFTs), organic light-emitting transistors (OLETs), organic solar cells (OSCs), organic optical detectors, organic laser diodes (O-lasers), organic field-quench devices (OFQDs), light-emitting electrochemical cells (LECs), "organic plasmon emitting devices", organic photovoltaic (OPV) elements or devices and organic photoreceptors (OPCs).

Besides the layer consisting of the formulation according to the invention, the electronic device may have further layers, for example an interlayer between anode and a light-emitting layer.

Besides the layer which has been produced from the formulation according to the invention, the electronic device according to the invention preferably comprises an anode and a cathode.

The cathode may be composed of various materials, as are used in accordance with the prior art. Examples of particularly suitable cathode materials are in general metals having a low work function, followed by a layer of aluminium or a layer of silver. Examples thereof are caesium, barium, calcium, ytterbium and samarium, in each case followed by a layer of aluminium or silver. Also suitable is an alloy of magnesium and silver.

The anode preferably comprises materials having a high work function. The anode preferably has a potential of greater than 4.5 eV vs. vacuum. Suitable for this purpose are on the one hand metals having a high redox potential, such as, for example, Ag, Pt or Au. On the other hand, metal/metal-oxide electrons (for example Al/Ni/NiO$_x$, Al/PtO$_x$) may also be preferred. For some applications, at least one of the electrodes must be transparent in order to facilitate either irradiation of the organic material (O—SC) or the coupling-out of light (OLED/PLED, O-lasers). A preferred structure uses a transparent anode. Preferred anode materials here are conductive mixed metal oxides. Particular preference is given to indium tin oxide (ITO) or indium zinc oxide (IZO). Preference is furthermore given to conductive, doped organic materials, in particular conductive doped polymers.

It should be pointed out that variations of the embodiments described in the present invention fall within the scope of this invention. Each feature disclosed in the present invention can, unless this is explicitly excluded, be replaced by alternative features which serve the same, an equivalent or a similar purpose. Thus, each feature disclosed in the present invention is, unless stated otherwise, to be regarded as an example of a generic series or as an equivalent or similar feature.

All features of the present invention can be combined with one another in any way, unless certain features and/or steps are mutually exclusive. This applies, in particular, to preferred features of the present invention. Equally, features of non-essential combinations can be used separately (and not in combination).

It should furthermore be pointed out that many of the features, and in particular those of the preferred embodiments of the present invention, are themselves inventive and are not merely to be regarded as part of the embodiments of the present invention. For these features, independent protection may be sought additionally or alternatively to each invention presently claimed.

The teaching regarding technical action disclosed with the present invention can be abstracted and combined with other examples.

The invention is explained in greater detail by the following examples without wishing to restrict it thereby.

EXAMPLES

The purity of the solvents used was determined by HPLC-MS (see also Becker et al., SID 10 Digest 39 (2010))

Example 1

Materials

The following materials are employed in OLEDs:

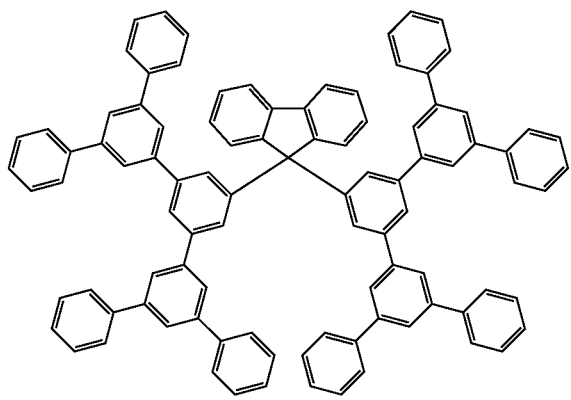

H1

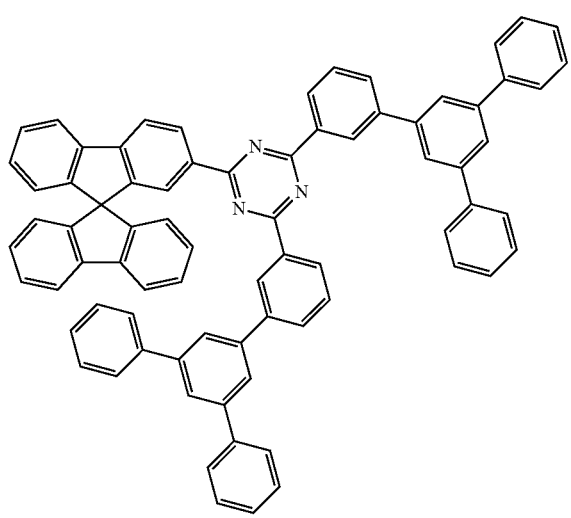

H2

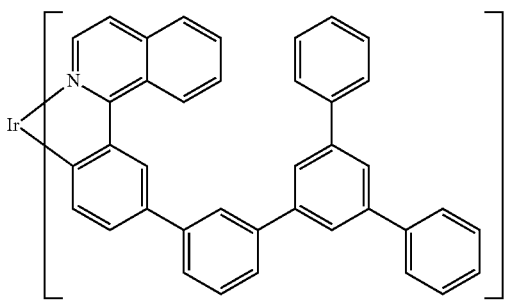

TR1

H1 and H2 are host materials, and were synthesised in accordance with WO 2009/124627 and DE 102008064200.2. TR1 is a red-phosphorescent emitter which was synthesised in accordance with DE 102009041414.2.

In addition, a blue-emitting polymer SPB-02T (Merck KGaA) is also used.

Example 2

Preparation of Various Formulations for Light-Emitting Layers (EML)

Solutions for EML, as summarised in Table 1, are prepared as follows: firstly, 240 mg of the compositions indicated are dissolved in 10 ml of toluene (purity 99.90%), where for solution 6 toluene having a degree of purity of 99.50% is used, and stirred until the solution is clear. The solution is filtered using a Millipore Millex LS, hydrophobic PTFE 5.0 µm filter. The solutions are then degassed using various noble gas.

TABLE 1

Composition of the solutions

| Solution | Composition | Ratio (based on weight) | Concentration | Gas/time |
|---|---|---|---|---|
| 1 | H1 + H2 + TR1 | 55:30:15 | 24 mg/ml | — |
| 2 | H1 + H2 + TR1 | 55:30:15 | 24 mg/ml | Ar/30 min |
| 3 | H1 + H2 + TR1 | 55:30:15 | 24 mg/ml | $N_2$/30 min |
| 4 | H1 + H2 + TR1 | 55:30:15 | 24 mg/ml | $CO_2$/30 min |
| 5 | SPB-02T | 100 | 10 mg/ml | Ar/30 min |
| 6 | SPB-02T | 100 | 10 mg/ml | Ar/30 min |

Example 3

Production of OLEDs 1 to 7

OLED 1 to OLED 5 having a structure in accordance with the prior art, buffer layer/interlayer/EML/cathode, and OLEDs 6 and 7 without interlayer, are produced in accordance with the following procedure using the corresponding solutions 1-6, as summarised in Table 1:

1) Coating of 80 nm of PEDOT (Clevios™ P VP AI 4083) as buffer layer onto an ITO-coated (ITO: indium tin oxide) glass substrate by spin coating in air in a clean room, where the glass substrate has been dried by heating at 180° C. for 10 min before the coating.
2) Coating of a 20 nm interlayer by spin coating of a toluene solution of HIL-012 (Merck KGaA, with concentration 0.5% by weight) in a glove box.
3) Drying of the interlayer by heating at 180° C. for 1 h in a glove box, 4) Coating of an 80 nm emitting layer (EML) by spin coating of a solution in accordance with Table 1, in air in a clean room (OLEDs 1-4) or in a glove box under Ar protective gas (OLED 5). Residence times of OLEDs 1-4 in air are 5 minutes.
5) Drying of the device by heating at 180° C. for 10 min in a glove box.
6) Vapour deposition of a Ba/Al cathode (3 nm+150 nm).
7) Encapsulation of the device.

TABLE 2

OLEDs using various processes

| OLEDs | Solution | Spin coating atmosphere |
|---|---|---|
| 1 | 1 | in air in clean room |
| 2 | 2 | in air in clean room |
| 3 | 3 | in air in clean room |
| 4 | 4 | in air in clean room |
| 5 | 2 | in glove box |
| 6 | 5 | in air in clean room |
| 7 | 6 | in air in clean room | where OLEDs 6 and 7 do not comprise an interlayer, and production steps 2) and 3) were omitted.

Example 4

Mixtures with the OLEDs and Comparison of the Results

The OLEDs obtained in this way are characterised by standard methods. The following properties are measured here: UIL characteristics, electroluminescence spectrum, colour coordinates, efficiency, operating voltage and lifetime. The results are summarised in Table 3. In Table 3, U(100) stands for the voltage at 100 cd/m$^2$.

TABLE 3

Measurement results of OLEDs 1 to 7

| | Max. eff. [cd/A] | U(100) [V] | CIE @ 100 cd/m$^2$ | Lifetime [hrs] |
|---|---|---|---|---|
| OLED 1 | 2.6 | 11.3 | 0.68/0.32 | 528 @ 1 knits |
| OLED 2 | 8.4 | 4.8 | 0.68/0.32 | 2700 @ 1 knits |
| OLED 3 | 8.0 | 5.2 | 0.68/0.32 | 2500 @ 1 knits |
| OLED 4 | 7.5 | 5.5 | 0.68/0.32 | 2300 @ 1 knits |
| OLED 5 | 8.8 | 4.5 | 0.68/0.32 | 2900 @ 1 knits |
| OLED 6 | 5.3 | 3.1 | 0.15/0.20 | 69 @ 800 nits |
| OLED 7 | 5.0 | 3.8 | 0.15/0.20 | 47 @ 800 nits |

As can be seen from Table 3, the organic electroluminescent devices comprising formulations according to the invention exhibit significantly improved performance in relation to operating voltage, efficiency and lifetime. OLEDs 2 to 4 also exhibit a comparable performance to OLED 5, in which the EML was applied in the glove box. This may be due to the noble gas in the solvent of the formulation employed preventing diffusion of oxygen into the EML.

Furthermore, OLED 6 and OLED 7 show that a further improvement in the performance can be achieved if a solvent having higher purity is used.

On the basis of the present technical teaching according to the invention, further optimisations can be achieved by means of various possibilities without being inventive. Thus, a further optimisation can be achieved, for example, by shortening the residence time in air or using other co-matrices or other emitters in the same or another concentration.

The invention claimed is:

1. A process for the preparation of a formulation comprising following steps:
   (a) at least one solvent is purified by recrystallization at low temperatures, vacuum evaporation, distillation and/or degassing using at least one inert gas;
   (b) at least one nanocrystal and/or a functional organic material which is selected from the group consisting of hole-transport materials, hole-injection materials, electron-transport materials, electron-injection materials, hole-blocking materials, electron-blocking materials, exciton-blocking materials, light-emitting materials, host materials, organic metal complexes, organic dyes and combinations thereof, is dissolved in the at least one solvent of step (a) in order to obtain a formulation;
   (c) the formulation obtained in step (b) is degassed using at least one inert gas in order to obtain a saturated or supersaturated formulation.

2. The process according to claim 1, in which the at least one nanocrystal is a colloidal quantum dot or a colloidal nanorod.

3. The process according to claim 1, in which the at least one functional organic material is a hole-transport material, a light-emitting material, a host material, an electron-transport material or a combination thereof.

4. The process according to claim 1, in which the formulation is a solution, an emulsion or a dispersion.

5. The process according to claim 1, in which the inert gas is $N_2$, a noble gas, $CO_2$ or a combination thereof.

6. The process according to claim 1, in which the content of inorganic, non-metallic impurities in the solvent is less than 500 ppm.

7. The process according to claim 1, in which the content of metallic impurities in the solvent is less than 500 ppm.

8. The process according to claim 1, in which the content of $O_2$ and $H_2O$ in the solvent taken together is less than 500 ppm.

9. The process according to claim 1, in which the purity of the solvent is at least 99.8% by weight.

10. The process according to claim 1, in which the at least one solvent is selected from the group consisting of optionally substituted aromatic or heteroaromatic hydrocarbon compounds, dialkylformamides, aliphatic or heteroaliphatic cyclic hydrocarbons and mixtures thereof.

11. A process for the production of an organic electronic device comprising utilizing the formulation obtained from the process according to claim 1.

12. The process according to claim 11, wherein the organic electronic device is an organic or polymeric electroluminescent device (OLED, PLED), an organic field-effect transistor (OFET), an organic integrated circuit (OIC), an organic thin-film transistor (OTFT), an organic light-emitting transistor (OLET), an organic solar cell (OSC), an organic optical detector, an organic laser diode (O-laser), an organic field-quench device (OFQD), an organic light-emitting electrochemical cell (OLEC), an organic plasmon emitting device, a dye-sensitized solar cell (DSSC), an organic photovoltaic (OPV) element or device or an organic photoreceptor (OPC).

13. An organically electronic device which has been produced by the process according to claim 11.

14. The process according to claim 1, wherein the formulation is supersaturated and at least 99% of the dissolved gases in the solvent are inert gases.

* * * * *